United States Patent
Matsuoka et al.

(10) Patent No.: US 8,073,075 B2
(45) Date of Patent: Dec. 6, 2011

(54) TRANSMISSION APPARATUS AND TRANSMISSION POWER CONTROL METHOD

(75) Inventors: Akihiko Matsuoka, Kanagawa (JP); Tomoya Urushihara, Chiba (JP); Wayne Lee, San Mateo, CA (US); Gary Do, San Jose, CA (US)

(73) Assignee: Panasonic Corporation, Osaka (JP)

( * ) Notice: Subject to any disclaimer, the term of this patent is extended or adjusted under 35 U.S.C. 154(b) by 894 days.

(21) Appl. No.: 12/013,301

(22) Filed: Jan. 11, 2008

(65) Prior Publication Data

US 2008/0175306 A1 Jul. 24, 2008

Related U.S. Application Data

(60) Provisional application No. 60/880,053, filed on Jan. 12, 2007.

(51) Int. Cl.
*H04K 1/02* (2006.01)
*H04L 25/03* (2006.01)
*H04L 25/49* (2006.01)

(52) U.S. Cl. ........ 375/297; 375/259; 375/260; 375/261; 348/723

(58) Field of Classification Search .................... 375/297
See application file for complete search history.

(56) References Cited

U.S. PATENT DOCUMENTS

| 2002/0154708 A1 | 10/2002 | Rouphael |
| 2005/0134377 A1* | 6/2005 | Dent .......................... 330/124 R |
| 2006/0140145 A1 | 6/2006 | Ogawa |
| 2008/0146174 A1* | 6/2008 | Flowers ..................... 455/127.1 |

FOREIGN PATENT DOCUMENTS

| JP | 11-284510 | 10/1999 |
| JP | 2001-136081 | 5/2001 |
| JP | 2005-295523 | 10/2005 |
| JP | 2006-186690 | 7/2006 |

OTHER PUBLICATIONS

International Search Report dated Apr. 15, 2008.

* cited by examiner

*Primary Examiner* — David C. Payne
*Assistant Examiner* — Erin File
(74) *Attorney, Agent, or Firm* — Dickinson Wright PLLC

(57) ABSTRACT

The transmission apparatus and transmission power controlling method are able to keep high speed feedback control and control transmission power accurately. Polar modulation transmitter (100) is provided with LPF (108) that performs waveform shaping of output power of PA (103) and ADC (109) that obtains output power data for each mode by sampling filtered signals in compressed mode and filtered signals in uncompressed mode at the same phase as the filtered signals in compressed mode. In this way, the phases of sampling signals before and after the mode change are the same, so that it is possible to obtain sampling signals of the same condition before and after the mode change, from filtered signal waveforms. According to feedback control based on these sampling signals, even if drift components remain in the filtered signals, the influence can be ignored, so that it is possible to keep high speed feedback control, and estimate and control transmission power accurately.

14 Claims, 23 Drawing Sheets

| TPC COMMAND | TRANSMISSION POWER CONTROL RANGE | | | | | |
|---|---|---|---|---|---|---|
| | 1dB STEP SIZE | | 2dB STEP SIZE | | 3dB STEP SIZE | |
| | LOWER SIDE | UPPER SIDE | LOWER SIDE | UPPER SIDE | LOWER SIDE | UPPER SIDE |
| 1 | +0.5dB | +1.5dB | +1dB | +3dB | +1.5dB | +4.5dB |
| 0 | −0.5dB | +0.5dB | −0.5dB | +0.5dB | −0.5dB | +0.5dB |
| −1 | −0.5dB | −1.5dB | −1dB | −3dB | −1.5dB | −4.5dB |

FIG.3
(RELATED ART)

| TARGET STEP SIZE | STEP SIZE TOLERANCES |
|---|---|
| 0dB | +/−0.5dB |
| 1dB | +/−0.5dB ← MOST RESTRICTIVE |
| 2dB | +/−1.0dB |
| 3dB | +/−1.5dB |
| 4−10dB | +/−2.0dB |
| 11−15dB | +/−3.0dB |
| 16−20dB | +/−4.0dB |
| ≥21dB | +/−6.0dB |

FIG.4
(RELATED ART)

| TPC COMMAND GROUP | TRANSMISSION POWER CONTROL RANGE AFTER 10 EQUAL TPC COMMAND GROUPS ARE PERFORMED | | | | | | TRANSMISSION POWER CONTROL RANGE AFTER 7 EQUAL TPC COMMAND GROUPS ARE PERFORMED | |
|---|---|---|---|---|---|---|---|---|
| | 1dB STEP SIZE | | 2dB STEP SIZE | | 3dB STEP SIZE | | | |
| | LOWER SIDE | UPPER SIDE | LOWER SIDE | UPPER SIDE | LOWER SIDE | UPPER SIDE | LOWER SIDE | UPPER SIDE |
| +1 | +8dB | +12dB | +16dB | +24dB | | | +16dB | +26dB |
| 0 | +1dB | +1dB | -1dB | +1dB | | | -1dB | +1dB |
| -1 | -8dB | -12dB | -16dB | -24dB | | | -16dB | -26dB |
| 0,0,0,+1 | +6dB | +14dB | N/A | N/A | | | N/A | N/A |
| 0,0,0,-1 | -6dB | -14dB | N/A | N/A | | | N/A | N/A |

IN THIS TABLE, THESE REQUIREMENTS ARE THE MOST RESTRICTIVE (AFTER 10 EQUAL STEPS WHICH ARE EACH 1 dB ARE PERFORMED, POWER DIFFERENCE MUST BE WITHIN 10 ± 2 dB)

FIG.5
(RELATED ART)

| VARIABLE | DEFINITION |
|---|---|
| PAM1,j | AM PATH SIGNAL POWER OF FIRST AM PATH AVERAGING TIMING |
| AM1,j | AM PATH SIGNAL OF FIRST AM PATH AVERAGING TIMING |
| PAM1,avg | AM PATH SIGNAL AVERAGE POWER OF FIRST AM PATH AVERAGING TIMING |
| PAM1 | LOG VALUE OF AM PATH SIGNAL AVERAGE POWER OF FIRST AM PATH AVERAGING TIMING |
| PAM2,j | AM PATH SIGNAL POWER OF SECOND AM PATH AVERAGING TIMING |
| AM2,j | AM PATH SIGNAL OF SECOND AM PATH AVERAGING TIMING |
| PAM2,avg | AM PATH SIGNAL AVERAGE POWER OF SECOND AM PATH AVERAGING TIMING |
| PAM2 | LOG VALUE OF AM PATH SIGNAL AVERAGE POWER OF SECOND AM PATH AVERAGING TIMING |
| FAM | RESIDUAL DRIFT COMPONENT OF AM PATH SIGNAL |
| PADC1,j | PA OUTPUT POWER OF FIRST ADC SAMPLING TIMING |
| PADC1 | PA AVERAGE OUTPUT POWER OF FIRST ADC SAMPLING TIMING |
| PADC2,j | PA OUTPUT POWER OF SECOND ADC SAMPLING TIMING |
| PADC2 | PA AVERAGE OUTPUT POWER OF SECOND ADC SAMPLING TIMING |
| FADC | RESIDUAL DRIFT COMPONENT INCLUDED IN PA OUTPUT SIGNAL READ ACCORDING TO ADC |
| Crel | DRIFT ESTIMATION COEFFICIENT |
| ΔP | AMOUNT OF POWER CHANGE |
| Pcur_set | POWER SETTING OF CURRENT POWER |
| Ptar_set | POWER SETTING OF TARGET POWER |
| Pcur,k | POWER IN CURRENT MODE READ ACCORDING TO ADC |
| Pcur | AVERAGE POWER IN CURRENT MODE READ ACCORDING TO ADC |
| AMcur,i | AM PATH SIGNAL IN CURRENT MODE |
| PAM_cur,i | AM PATH SIGNAL POWER IN CURRENT MODE |
| PAM_cur_avg | AM PATH SIGNAL AVERAGE POWER IN CURRENT MODE |
| PAM_cur | LOG VALUE OF AM PATH SIGNAL AVERAGE POWER IN CURRENT MODE |
| Ptar,k | POWER IN TARGET MODE READ ACCORDING TO ADC |
| Ptar | AVERAGE POWER IN TARGET MODE READ ACCORDING TO ADC |
| AMtar,i | AM PATH SIGNAL IN TARGET MODE |
| PAM_tar,i | AM PATH SIGNAL POWER IN TARGET MODE |
| PAM_tar_avg | AM PATH SIGNAL AVERAGE POWER IN TARGET MODE |
| PAM_tar | LOG VALUE OF AM PATH SIGNAL AVERAGE POWER IN TARGET MODE |
| Ptar_set | ADJUSTED POWER SETTING IN TARGET MODE |

FIG.25

TRANSMISSION APPARATUS AND TRANSMISSION POWER CONTROL METHOD

CROSS REFERENCE TO RELATED APPLICATIONS

The disclosure of Provisional U.S. Patent Application No. 60/880,053, filed on Jan. 12, 2007, including the specification, drawings and abstract, is incorporated herein by reference in its entirety.

BACKGROUND OF THE INVENTION

1. Field of the Invention

The present invention relates to a transmission apparatus and transmission power control method using a power amplifier (hereinafter "PA").

2. Description of Related Art

FIG. 1 shows an example of a typical transmission apparatus using a polar modulation scheme. The transmission apparatus has polar signal generation circuit 1, amplitude control circuit 2, phase modulated signal generation circuit 3 and PA 4. In this transmission apparatus, polar signal generation circuit 1 generates a signal from an input signal (i.e. a transmission modulated signal) signals related to the amplitude and phase of a transmission modulated signal. Amplitude control circuit 2 controls power supply voltage supplied to PA 4 based on amplitude component signals, and phase modulated signal generation circuit 3 generates phase modulated signals inputted to PA 4 based on phase component signals.

In practice, this transmission apparatus secures the dynamic range of transmission power by changing PA 4 between compressed mode and uncompressed mode. Further, compressed mode may be referred to as "saturated operation mode" and uncompressed mode as "non-saturated operation mode."

This transmission apparatus operates PA 4 in compressed mode when high transmission power is required. On the other hand, the transmission apparatus operates PA 4 in uncompressed mode when low transmission power is required. To be more specific, in compressed mode, the transmission apparatus performs amplitude modulation by changing the power supply to PA 4 according to amplitude component signals. In this compressed mode, essentially, there is very little drift of output power. On the other hand, in uncompressed mode, the transmission apparatus operates PA 4 in a state where output power drifts greater than in compressed mode.

However, with conventional transmission apparatuses, when compressed mode ("c-mode") and uncompressed mode ("u-mode") change in transmission power control, transmission power drift of maximum 5 dB or greater is likely to occur due to differences in characteristics between the modes (i.e. drift due to temperature, drift due to wear, and drift due to load, etc.).

This will be explained briefly using FIG. 2. As shown in FIG. 2, output power in compressed mode is relatively accurate, but output power in uncompressed mode changes due to drift (i.e. drift due to temperature, drift due to wear, and drift due to load, etc.).

As shown in FIG. 2, output power in uncompressed mode is likely to drift due to various factors, and so, when compressed mode and uncompressed mode change, output power in uncompressed mode is likely to be discontinuous, and, as a result, significant drift in transmission power is likely to occur.

By the way, one method of performing transmission power control accurately is to measure the actual output power of a power amplifier and perform feedback control of output power such that this measurement value becomes equal to a set target value.

Generally, for this feedback control, the method of eliminating modulation drift components resulting from transmission data from output of the power amplifier using a low-pass filter, is employed. Then, transmission power is adjusted based on the difference between the set target value and the average transmission power which eliminates modulation drift components.

Here, more drift components such as modulated components can be eliminated by setting the time constant for the low-pass filter greater, so that it is possible to perform more accurate transmission power control.

On the other hand, if the time constant for a low-pass filter is set greater, the response of the low-pass filter becomes poorer, and, consequently, accompanying this, the responsivity of feedback control becomes poorer. There are wireless communication standards that require that transmission power control be completed in a very short period, and so, in practice, the time constant for the low-pass filter cannot be set greater significantly.

Therefore, such conventional transmission apparatuses of these kinds must perform transmission power control based on a measurement result showing that modulation drift components remain to some extent, and so the accuracy of transmission power control deteriorates by the amount of the modulation drift components.

On the other hand, limit is placed on differences in transmission power depending on communication standards. For example, according to 3GPP (3rd Generation Partnership Project) 25.101, differences in transmission power need to fulfill the requirements shown in FIG. 3 to FIG. 5.

This will be explained in detail. The Third Generation Partnership Project (3GPP), which is the standards body responsible for promulgating UMTS and W-CDMA standards, requires that TPC commands from a cellular network base station result in a mobile terminal increasing or decreasing its output power level in discrete steps (e.g., ±1 dB, ±2 dB, ±3 dB, etc.). The UMTS standard also specifies that these power increasing and decreasing steps be performed within certain specified tolerances.

For example, as shown in the table of FIG. 3, in case of a TPC command for increasing and decreasing output power by a ±1 dB step, resulting output power is required to be within ±0.5 dB of target output power. Then, for example, if the transmission apparatus of a mobile terminal operates at output power 0 dBm and receives a TPC command for "1," the transmission apparatus of the mobile terminal must adjust transmission power to be within the range between +0.5 dBm and 1.5 dBm. Wider tolerances of ±1 dB and ±1.5 dB are permitted for larger step sizes of 2 dB and 3 dB.

The 3GPP UMTS standard also imposes cumulative tolerances for groups of power commands, as shown in the table in FIG. 5. It is required that, for example, for ten equal TPC commands of 1 dB step size each, the resulting output power level be within ±2 dB of the target output power level.

As shown in the list of the table of FIG. 3 and FIG. 4, the most restrictive step size for a single TPC command is for a TPC command directing a ±1 dB (±0.5 dB tolerance is required).

As explained above, a transmission apparatus of this kind is expected to keep high speed feedback control and control transmission power accurately.

SUMMARY OF THE INVENTION

It is therefore an object of the present invention to provide a transmission apparatus and a transmission power control method that can keep high speed feedback control and control transmission power accurately.

The transmission apparatus according to the present invention that has mode of operating a power amplifier in compressed mode and mode of operating the power amplifier in uncompressed mode, employs a configuration including: a filter that performs waveform shaping of an output of the power amplifier; an analogue to digital converting section that obtains output power data for each mode by sampling a filtered signal in compressed mode and sampling a filtered signal in uncompressed mode at a same phase as the filtered signal in compressed mode; and a transmission power controlling section that controls output power of the power amplifier upon a mode change, based on the output power data for each mode obtained in the analogue to digital converting section.

According to the present invention, it is possible to provide a transmission apparatus and a transmission power control method that can keep high speed feedback control and control transmission power accurately.

BRIEF DESCRIPTION OF THE DRAWINGS

The above and other objects and features of the invention will appear more fully hereinafter from a consideration of the following description taken in connection with the accompanying drawings, in which:

FIG. 3 shows power control tolerances for output power step size commands according to the 3GPP UMTS standard;

FIG. 4 lists tolerance step sizes;

FIG. 5 shows cumulative power control tolerances for groups of power commands according to the 3GPP UMTS standard;

FIG. 25 illustrates parameters used in the flowcharts of FIG. 23 and FIG. 24.

DETAILED DESCRIPTION OF THE PREFERRED EMBODIMENT

With reference now to the attached drawings, embodiments of the present invention will be explained in detail below.

(Embodiment 1)

(1) Overall Configuration

Figure 1:
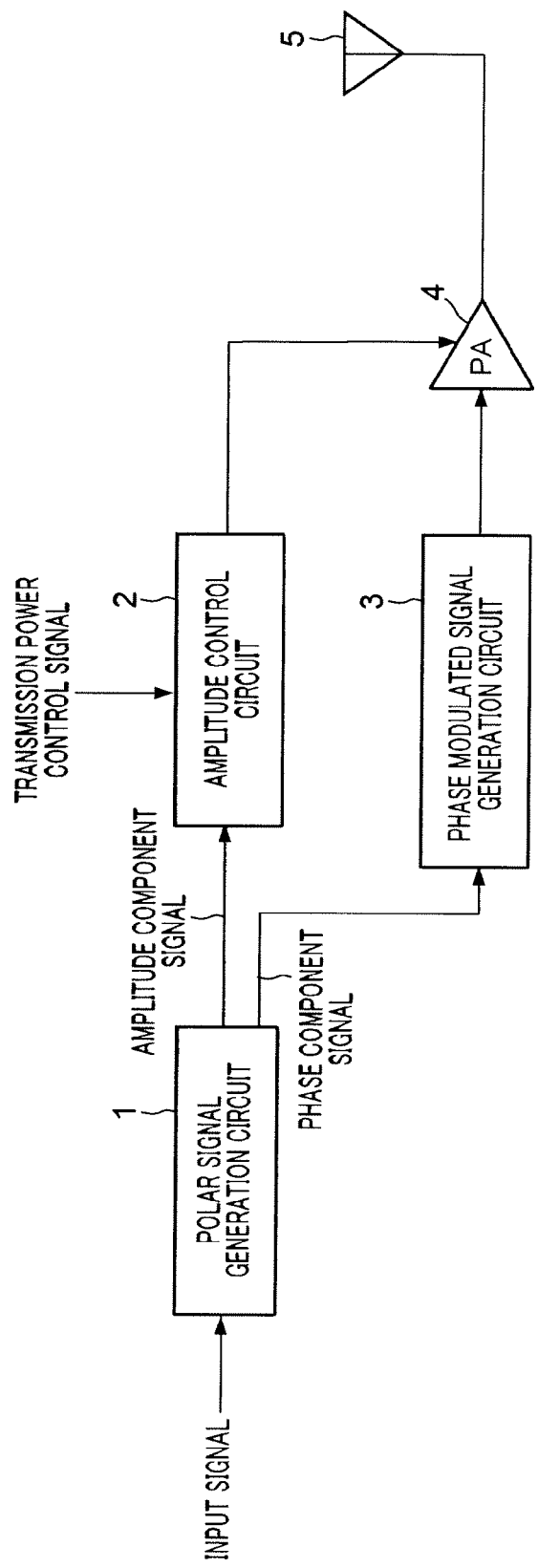
FIG. 1 is a block diagram showing a configuration example of a conventional transmission apparatus.
Figure 2:
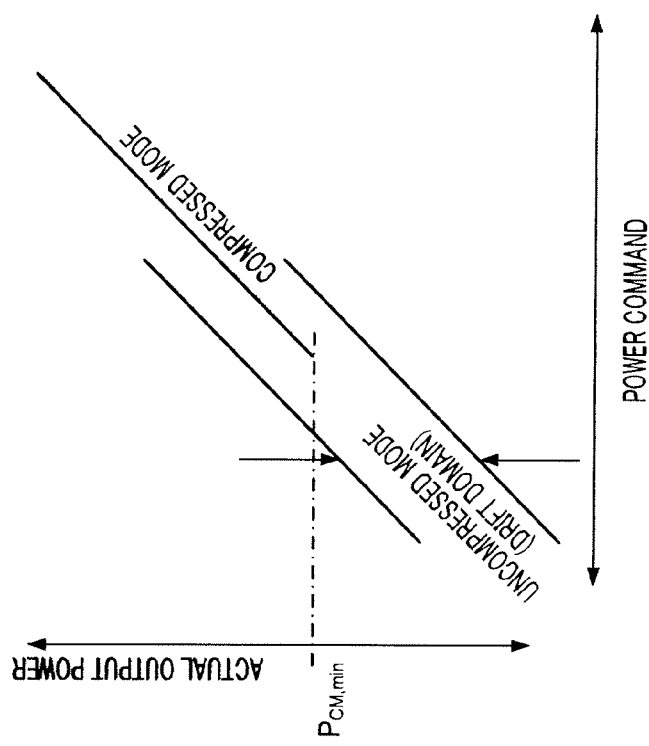
FIG. 2 illustrates drift in transmission power (i.e. discontinuity in output power) resulting from a mode change.
Figure 6:
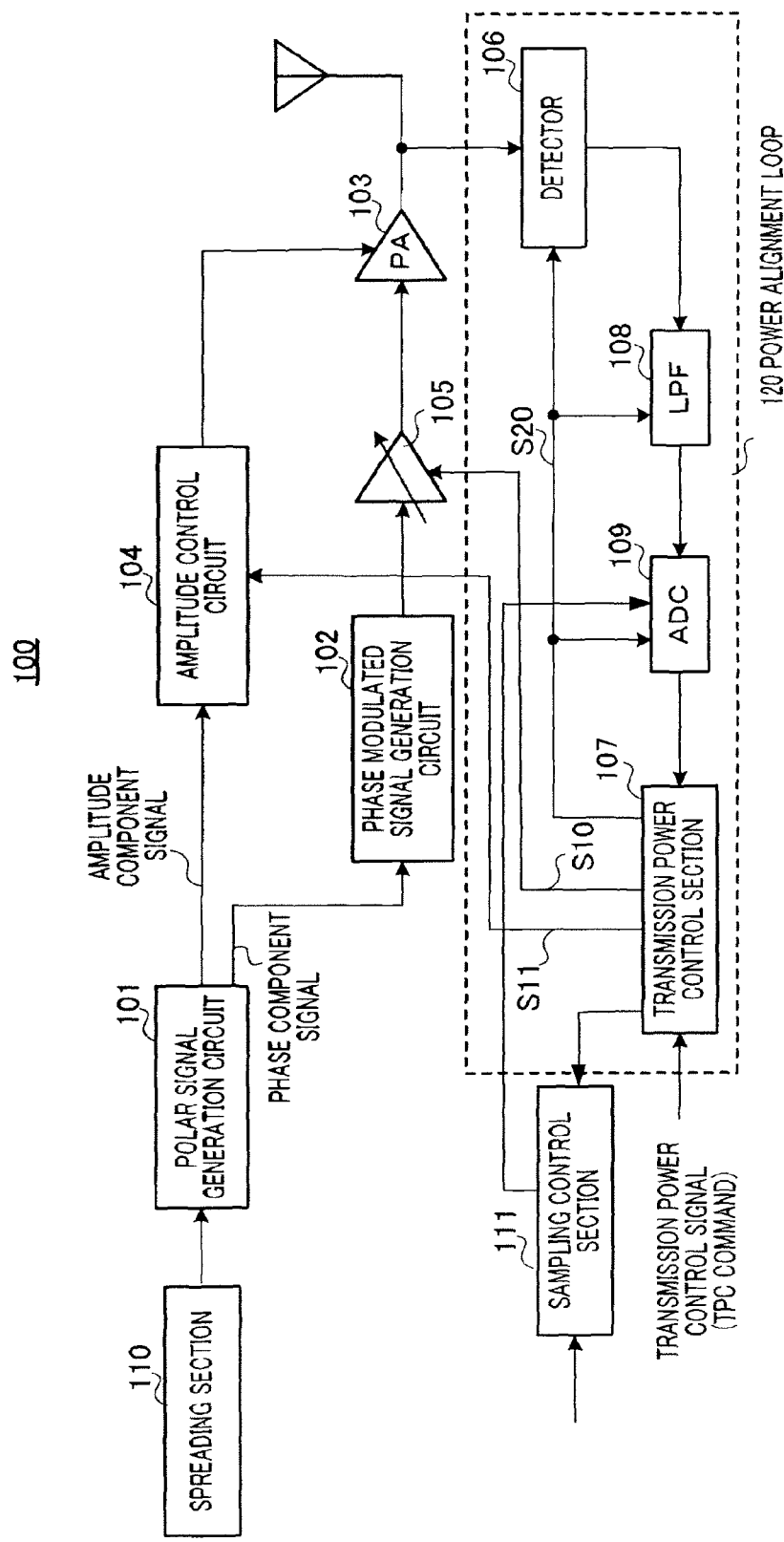
FIG. 6 is a block diagram showing a polar modulation transmitter according to Embodiment 1 of the present invention.

FIG. 6 shows the configuration of a polar modulation transmitter according to Embodiment 1 of the present invention. Polar modulation transmitter 100 has spreading section 110, polar signal generation circuit 101, phase modulated signal generation circuit 102, power amplifier (PA) 103, amplitude control circuit 104, variable amplifier 105 formed with a variable gain amplifier (VGA) and/or an attenuator, power alignment loop 120 and sampling control section 111.

Power alignment loop 120 has detector 106 that detects output power of PA 103, transmission power control section 107, LPF 108, and ADC 109.

Spreading section 110 spreads an input signal (i.e. quadrature modulated signal) by a spreading code, and outputs the signal to polar signal generation circuit 101. When generating, for example, an HSUPA (High Speed Uplink Packet Access) signal, spreading section 110 multiplies the DPDCH signal, DPCCH signal, HS-DPCCH signal, E-DPDCH signal, and E-DPCCH signal by spreading codes Cd, Cc, Chs, Ced, and Cec, respectively, adjusts gain factors Beta ratio c (Bc), Beta ratio d (Bd), Beta ratio hs (Bhs), Beta ratio ed (Bed), and Beta ratio ec (Bec), generates an HSUPA signal, and outputs the generated HSUPA signal to polar signal generation circuit 101.

Polar signal generation circuit 101 generates amplitude component signals and phase component signals from input signals. To be more specific, polar signal generation circuit 101 operates according to the input signal from spreading section 110, and generates an envelope component signal (i.e. amplitude component signal) containing amplitude information of the input signal, and a constant-envelope component signal (i.e. phase component signal) containing phase information of the input signal. The envelope component signal is inputted to amplitude control circuit 104 along the amplitude path and the constant amplitude phase component signal is inputted to phase modulated signal generation circuit 102.

Phase modulated signal generation circuit 102 generates an RF phase modulated signal from the phase component signal. Variable amplifier 105 amplifies and attenuates the RF phase modulated signal based on phase path scaling coefficients (i.e. phase-path magnitude scaling) S10 obtained at power alignment loop 120, and then supplies this scaled RF phase modulated signal to the RF signal input terminal of PA 103.

Amplitude control circuit 104 generates power supply voltage of PA 103 by multiplying the amplitude component signal by amplitude path scaling coefficients (i.e. AM-path envelope scaling) S11 from transmission power control section 107, and supplies this power supply voltage to the power supply input terminal of PA 103.

Detector 106 is formed with, for example, PIN diodes or other semiconductor detectors, and detects output power of PA 103.

LPF 108 is formed with, for example, an RC circuit and obtains an average output power value of PA 103 by integrating output power detection results of PA 103.

ADC 109 samples output results of LPF 108 according to control by sampling control section 111. This sampling control will be explained later.

Transmission power control section 107 receives an input of output of detector 106 through LPF 108 and ADC 109. Further, transmission power control section 107 also receives inputs of transmission power control signals (i.e. transmission power control commands).

Transmission power control section 107 determines the set transmission power for transmission power of polar modulation transmitter 100 based on the transmission power control signals and the average output power value of PA 103, and controls transmission power for polar modulation transmitter 100.

After having determined set transmission power, transmission power control section 107 controls the power supply voltage level of PA 103 and the input signal (i.e. RF phase modulated signal) level of PA 103 by sending out the amplitude path scaling coefficients to amplitude control circuit 104 and the phase path scaling coefficients to variable amplifier 105.

Transmission power control section 107 calculates final scaling coefficients S10 and S11 by summing the original values of scaling coefficients obtained by referring to a table using the transmission power control signals as addresses, and the correction values of scaling coefficients determined from the average output power value of PA 103.

That is, transmission power control section 107 of this embodiment has a table associating TPC commands with scaling coefficients (hereinafter referred to as the "power table").

Figure 7:
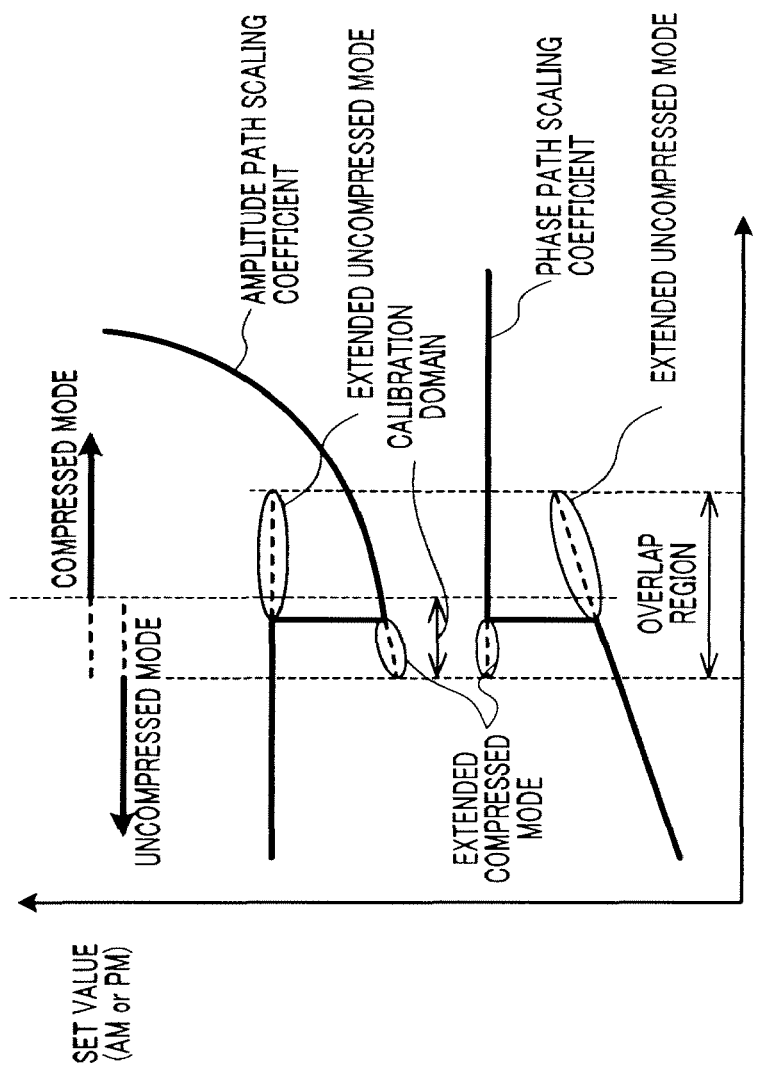
FIG. 7 illustrates a set of scaling coefficients provided in a transmission power control section.

FIG. 7 illustrates a set of scaling coefficients of the power table provided in transmission power control section 107. In compressed mode, the output power of polar modulation transmitter 100 is controlled based on power supply voltage that is subjected to amplitude modulation and given to the collector (or drain) node of PA 103, and the power of a phase modulated RF signal with a constant amplitude is kept constant. In uncompressed mode, output power of PA 103 is controlled by keeping constant the scaling coefficients multiplied upon the envelope of the amplitude path and changing the scaling coefficients multiplied upon a drive signal in the phase path. However, in either operation mode, the scaling coefficients (that is, in compressed mode, the phase path scaling coefficients multiplied upon phase modulated RF signals, and, in uncompressed mode, the amplitude path scaling coefficients multiplied upon the envelope of the amplitude path) that are not used in power control, do not need to be kept constant, and may be adjusted to correct output power or improve output distortion characteristics or noise characteristics of a power amplifier.

In practice, as shown in FIG. 7, transmission power control section 107 has a set of compressed mode scaling coefficients and a set of uncompressed mode scaling coefficients. In this embodiment, the set of compressed mode scaling coefficients and the set of uncompressed mode scaling coefficients have an overlap region in the mode transition area.

Even when either one of compressed mode and uncompressed mode is selected, the overlap region is where required output power can be generated. To be more specific, in practice, compressed mode and uncompressed mode can be realized by providing the amplitude path scaling coefficients and phase path scaling coefficients shown by solid lines in FIG. 7. With this embodiment, the set of scaling coefficients shown by dotted lines are provided in addition to the set of scaling coefficients shown by solid lines, thereby providing an overlap region where the ranges of a compressed mode region and an uncompressed mode region are extended to enable PA 103 to operate in either compressed mode or uncompressed mode.

The calibration region refers to an output power range where discontinuity in transmission power is likely to occur upon mode transition and where calibration is likely to be necessary. With this embodiment, mode change of PA 103 is performed by selecting scaling coefficients S10 and S11 so as not to allow discontinuity in transmission power in this calibration region.

In this way, whether PA 103 operates in compressed mode or in uncompressed mode is determined according to scaling coefficients calculated by transmission power control section 107.

An example of a method of calculating scaling coefficients will be explained below. Scaling coefficients in the power table are as shown in table 1.

[Table 1]

TABLE 1 example of data set stored in the power table

| Address | Output power level setting value | Phase path scaling coefficient | Amplitude path scaling coefficient |
|---------|----------------------------------|--------------------------------|-------------------------------------|
| 001 | −11 dBm | 90 | 100 |
| 002 | −10 dBm | 100 | 100 |
| 003 | −9 dBm | 110 | 100 |
| 004 | −8 dBm | 120 | 100 |
| ... | ... | ... | 100 |

Here, a method of calculating phase path scaling coefficients will be explained with reference to a case where, when polar modulation transmitter 100 operating in uncompressed mode performs "outputting phase path scaling coefficient 100 at output power −10 dBm in PA 103," transmission power control section 107 starts and decides to "increase output power of PA 103 because the level difference from the output power level in compressed mode operation is 0.3 dBm."

According to table 1, as the change from the phase path scaling coefficient "100" during uncompressed mode operation, the phase path scaling coefficient is set to "103" by adding an increase "+3" of the phase path scaling coefficient equal to an increase "+0.3 dBm" of the output power level.

Further, to increase output of PA 103 by only "+1 dBm," the above calculation needs not to be performed, and "address 003" adjacent to "address 002" storing scaling coefficient "100," may be referred to directly.

In this embodiment, detector 106, LPF 108 and ADC 109 of power alignment loop 120 operate only when necessary. To be more specific, according to inputted TPC commands, transmission power control section 107 sends out ON/OFF control signals S20 to LPF 108 and ADC 109. For example, as shown in FIG. 4, if a TPC command specifies restrictive target step size tolerances such as 1 dB, 2 dB, and 3 dB, an ON control signal is outputted as ON/OFF control signal S20. By contrast with this, if a TPC command specifies less restrictive target step size tolerances such as 4 dB or greater, an OFF control signal is outputted as ON/OFF control signal S20. In this way, power alignment loop 120 can be operated only when necessary, practically, so that it is possible to reduce power consumption.

As explained above, by measuring output power of PA 103 by power alignment loop 120 and selecting amplitude path scaling coefficient S11 and phase path scaling coefficient S10, polar modulation transmitter 100 of this embodiment is able to reduce discontinuity (in particular, discontinuity upon mode transition) in output power of PA 103 upon transmission power change.

(2) Sampling Control

As explained above, to control transmission power accurately, a method of measuring actual output power of PA 103 and performing feedback control of output power such that this measurement value becomes equal to the set target value, is employed.

LPF 108 is provided to reduce drift in the output power detection value of PA 103 obtained by detector 106.

By the way, if the cut-off frequency of LPF 108 is set too high, drift cannot be reduced sufficiently. On the other hand, if the cut-off frequency is set too low, output of LPC 108 after power adjustment takes time to become stable, and so it is difficult to finish power control within the time designated according to, for example, the 3GPP standard. By the way, according to the 3GPP standard, power control is required to be performed within the range of ±25 μsec from the symbol boundary. To meet this requirement, the time constant for LPF 108 needs to be less than several μsec. In practice, the time constant for LPF 108 needs to be set such that instantaneous envelope drift in a modulated signal can be canceled. The cut-off frequency is preferably in the range of several dozens to hundreds of kHz. In this embodiment, as an example, the cut-off frequency is 300 kHz.

For this reason, drift components that cannot be eliminated by LPF 108 remain in output of LPF 108. These drift components result from the fundamental period (i.e. the chip rate of the spreading code) of a spread modulated signal resulting from the pattern of the spreading code used at spreading section 110.

Then, sampling control section 111 controls sampling in ADC 109 such that the difference between average transmission power and the set target value can be determined accurately, when drift components remain.

To be more specific, sampling control section 111 obtains information related to the fundamental period of the spread modulated signal (hereinafter referred to as "fundamental period information" as appropriate) resulting from the pattern of the spreading code used in spreading section 110. Sampling control section 111 generates sampling period information matching with the fundamental period of the spread modulated signal resulting from the pattern of the spreading code. Further, sampling control section 111 specifies candidate timings where peaks appear periodically in output of LPF 108, based on fundamental period information, and obtains a timing, apart from the candidate timings where peaks appear, as a sampling start timing. Then, sampling control section 111 outputs a sampling control signal including generated sampling period information and the sampling start timing, to ADC 109.

ADC 109 samples output of LPF 108 with the sampling start timing in the sampling period according to the sampling control signal from sampling control section 111, and outputs sample signals to transmission power control section 107.

(3) Operation of Polar Modulation Transmitter 100

Next, the operation of polar modulation transmitter 100 having the above configuration will be explained with reference to FIG. 6 to FIG. 12.

A case where current mode is compressed mode will be explained below with reference to the power setting flowchart shown in FIG. 8.

First, when power adjustment value ΔP, which is specified by the transmission power control signal (for example, TPC) transmitted from the base station (not shown), is obtained (step S201), whether power adjustment value ΔP is zero or more, that is, whether the transmission power control signal designates "UP," "KEEP" or "DOWN" of transmission power is decided (step S202).

When power adjustment value ΔP is less than zero (step S202: "No"), it is decided that the transmission power control signal designates "DOWN" of transmission power, and, as a result of keeping transmission power "DOWN," whether or not mode is changed to uncompressed mode is decided (step S203).

If the mode change is performed (step S203: "Yes"), detector 106 is set in operation mode in step S204, and the detection result of output power of PA 103, which is output of detector 106, is subjected to waveform shaping through LPF 108 and outputted.

Figure 10:
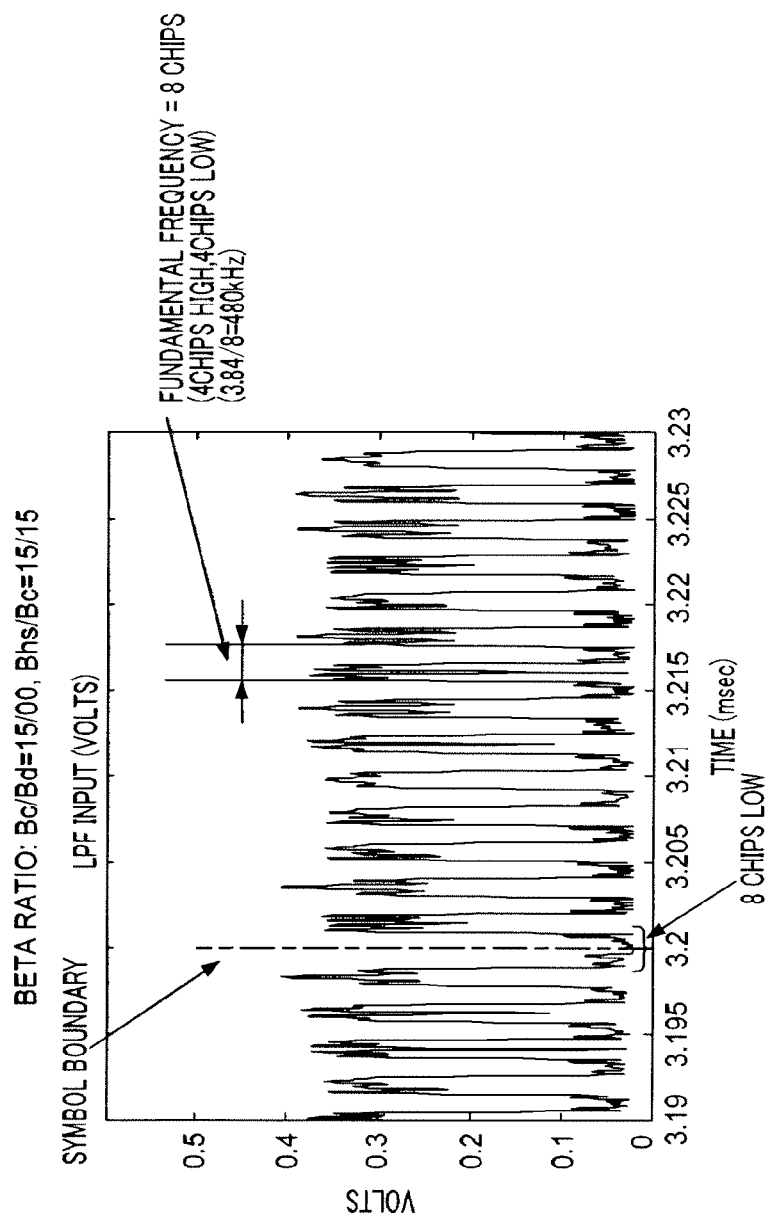
FIG. 10 shows an output waveform of a detector.

Here, as shown in FIG. 10, voltage of output of detector 106 drifts periodically between values near 0 [V] and greater values (in this figure, near 0.35 [V]). The periodicity of output voltage drift in this detector 106 results from the fundamental period of the spread modulated signal resulting from the pattern of the spreading code used to spread a quadrature modulated signal. In FIG. 10, output voltage drift of detector 106 shows an eight chip period (that is, values are near 0 [V] for an eight chip period and values are near 0.35 [V] for the next eight chip period) or shows a four chip period, which is half of an eight chip period. Further, the situation where "HIGH" continues eight chips and "LOW" continues eight chips, occurs near symbol boundaries.

Figure 11B:
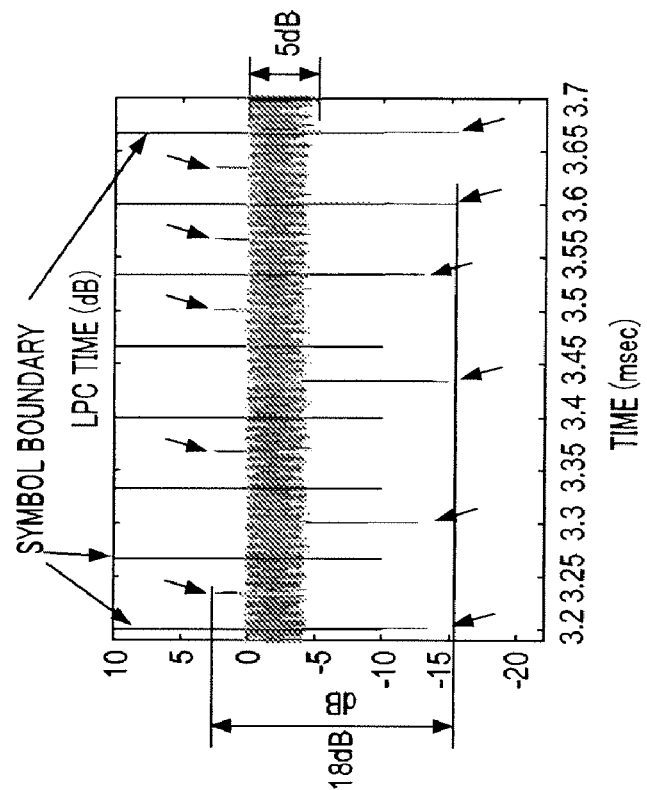
FIG. 11 shows an LPF output waveform.
Figure 11A:
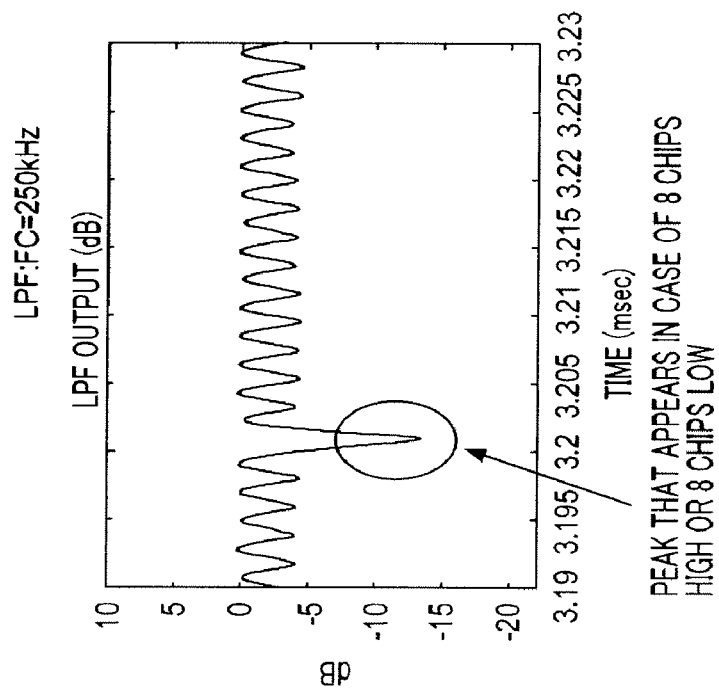

FIG. 11 shows output of LPF 108 obtained by performing waveform shaping of output of this detector 106. LPF 108 is required to keep output voltage within a predetermined range (hereinafter referred to as the "target settling range" as appropriate). As shown in FIG. 11A, output of LPF 108 shows peaks of 10 dB or greater, which exceed the target settling range, in addition to the part within the range of 5 dB (in this case matching with the target settling range here), that is, in addition to a target portion used in subsequent transmission power control section 107.

This target portion used in transmission power control section 107 shows the periodicity (that is, a predetermined frequency) as shown in FIG. 11A. This periodicity matches with the fundamental period itself of the spread modulated signal resulting from the pattern of the spreading code used to spread a quadrature modulated signal.

Further, peaks appear in output of LPF 108 on a regular basis as shown in FIG. 11B. The candidate timings where peaks appear can be specified from the fundamental period of the spread modulated signal resulting from the pattern of the spreading code used to spread the above quadrature modulated signal. To be more specific, the candidate timings where peaks appear come immediately after boundaries between transmission symbols in periods of integral multiples of the fundamental period.

Figure 8:
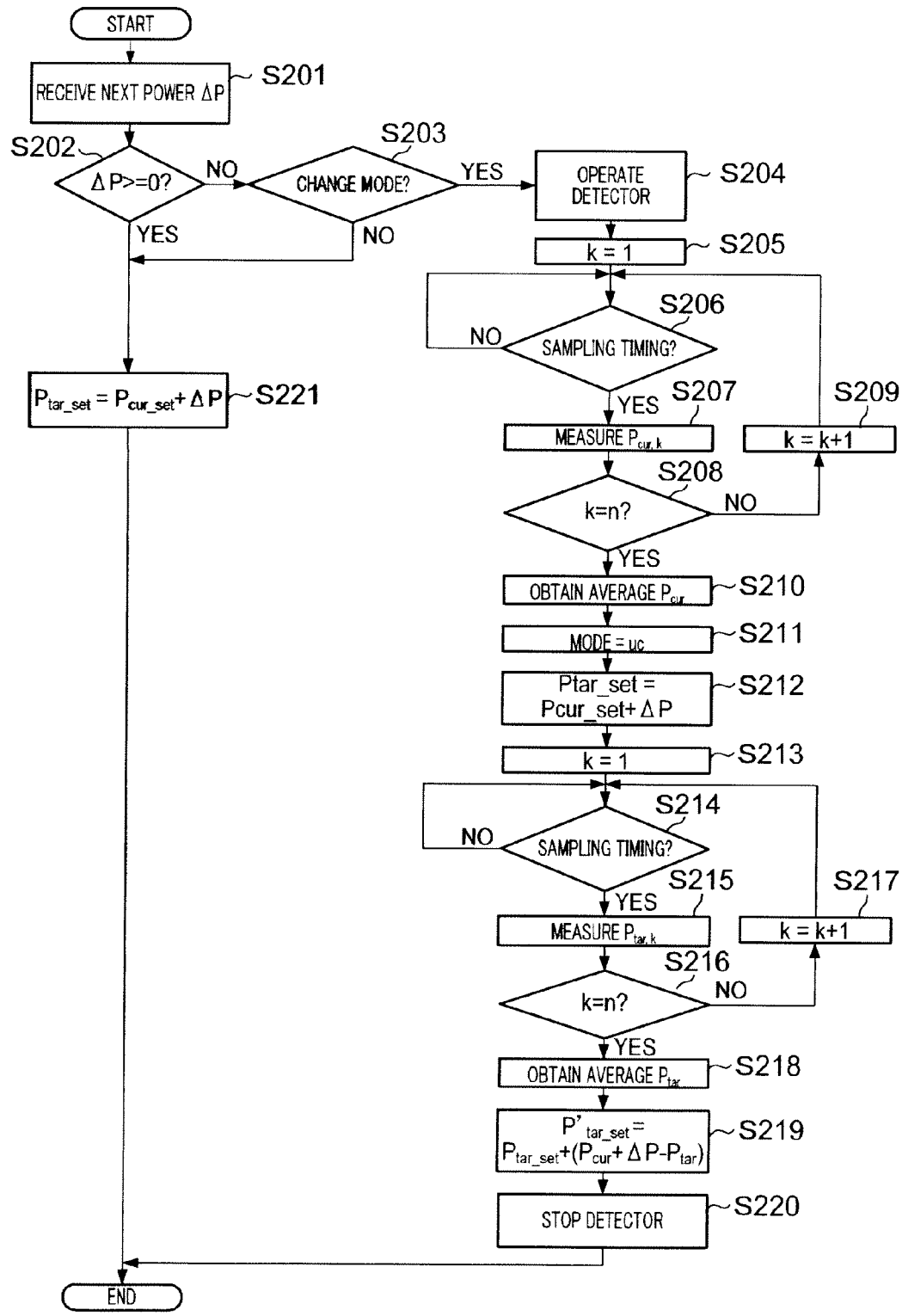
FIG. 8 is a power setting flowchart illustrating the operation of the polar modulation transmitter.

Back to the flow of FIG. 8, in step S205 to step S209, output of LPF 108 is sampled by ADC 109.

Here, the target samples used in transmission power control section 107 come from parts within the predetermined range in output of LPF 108, and so ADC 109 needs to perform sampling avoiding peaks. Then, sampling control section 111 generates sampling period information matching with the fundamental period of the spread modulated signal resulting from the pattern of the spreading code, obtains a timing as a sampling start timing, apart from the specified candidate timings where peaks appear and controls sampling in ADC 109 according to the sampling control signal including sampling period information and the sampling start timing. In practice, the operation start timing of ADC 109 matches with the symbol boundary, but ADC 109 requires a certain amount of time to operate stably. For this reason, the sampling start timing is the timing when ADC 109, which started operating at the timing of the symbol boundary, is able to operate stably, and is a timing, apart from the above candidate timings where peaks appear.

ADC 109 starts sampling from the sampling start timing included in the sampling control signal, and measures voltage value $P_{Cur,k}$ at sampling timings in a period matching with sampling period information until a predetermined number of samplings n is reached. In this way, ADC 109 is able to perform sampling avoiding peaks.

Measured voltage value $P_{Cur,k}$ is averaged by transmission power control section 107, and average value $P_{Cur}$ is determined (step S210).

In step S211, mode is changed to uncompressed mode. That is, the sampling performed in step S205 to step S209 is performed in compressed mode, which is mode before mode change.

When mode is changed, transmission power control section 107 sends out a set of scales such that the target voltage is reached in step S212, to amplitude control circuit 104 and variable amplifier 105.

However, a difference is likely to be generated between target voltage $P_{Tar\_set}$ and voltage $P_{Tar}$ actually obtained, and so the target voltage is adjusted in or after step S213.

In step S213 to step S217, ADC 109 starts sampling after the setting time, and measures voltage value $P_{Tar,k}$ of the sampling timing in a period matching with sampling period information until predetermined number of sampling n is reached.

Measured voltage value $P_{Tar,k}$ is averaged by transmission power control section 107, and average value $P_{Tar}$ is determined (step S218).

In step S219, transmission power control section 107 sends out a set of scales such that target voltage $P'_{Tar\_Set} = P_{Tar\_Set} + (P_{Cur} + \Delta P - P_{Tar})$, to amplitude control circuit 104 and variable amplifier 105. This concludes transmission power adjustment, and, in step 220, detector 106 is set in non-operation state.

Figure 12:
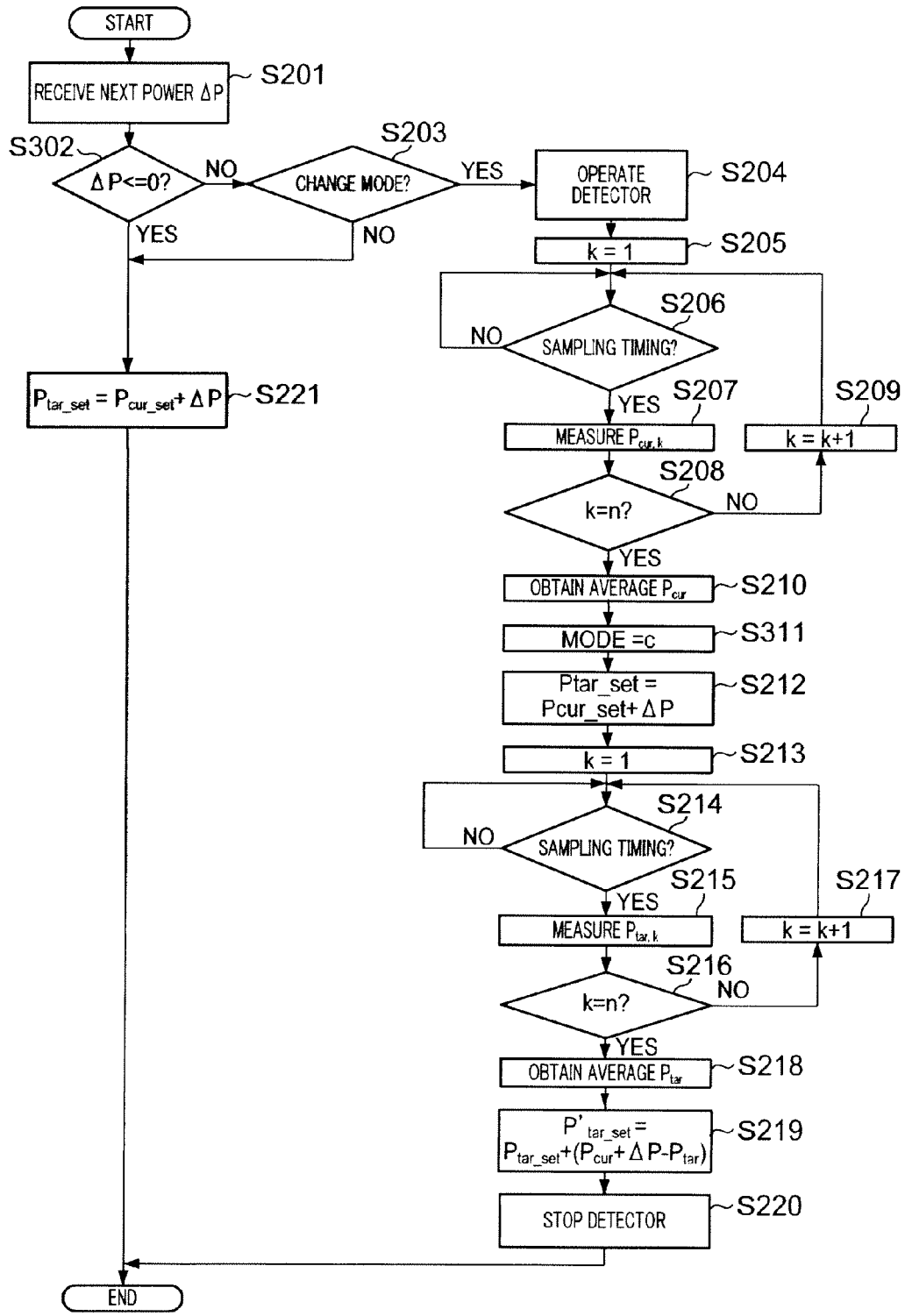
FIG. 12 is a power setting flowchart illustrating the operation of the polar modulation transmitter.

FIG. 12 is a power setting flow in a case where current mode is in uncompressed mode. This flow is the same as shown in FIG. 8 except that the decision criterion in step S302 is opposite (that is, whether or not power adjustment value $\Delta P$ is zero or less) to the decision criterion in FIG. 8, and the mode change in step S311 is from uncompressed mode to compressed mode.

Figure 9:
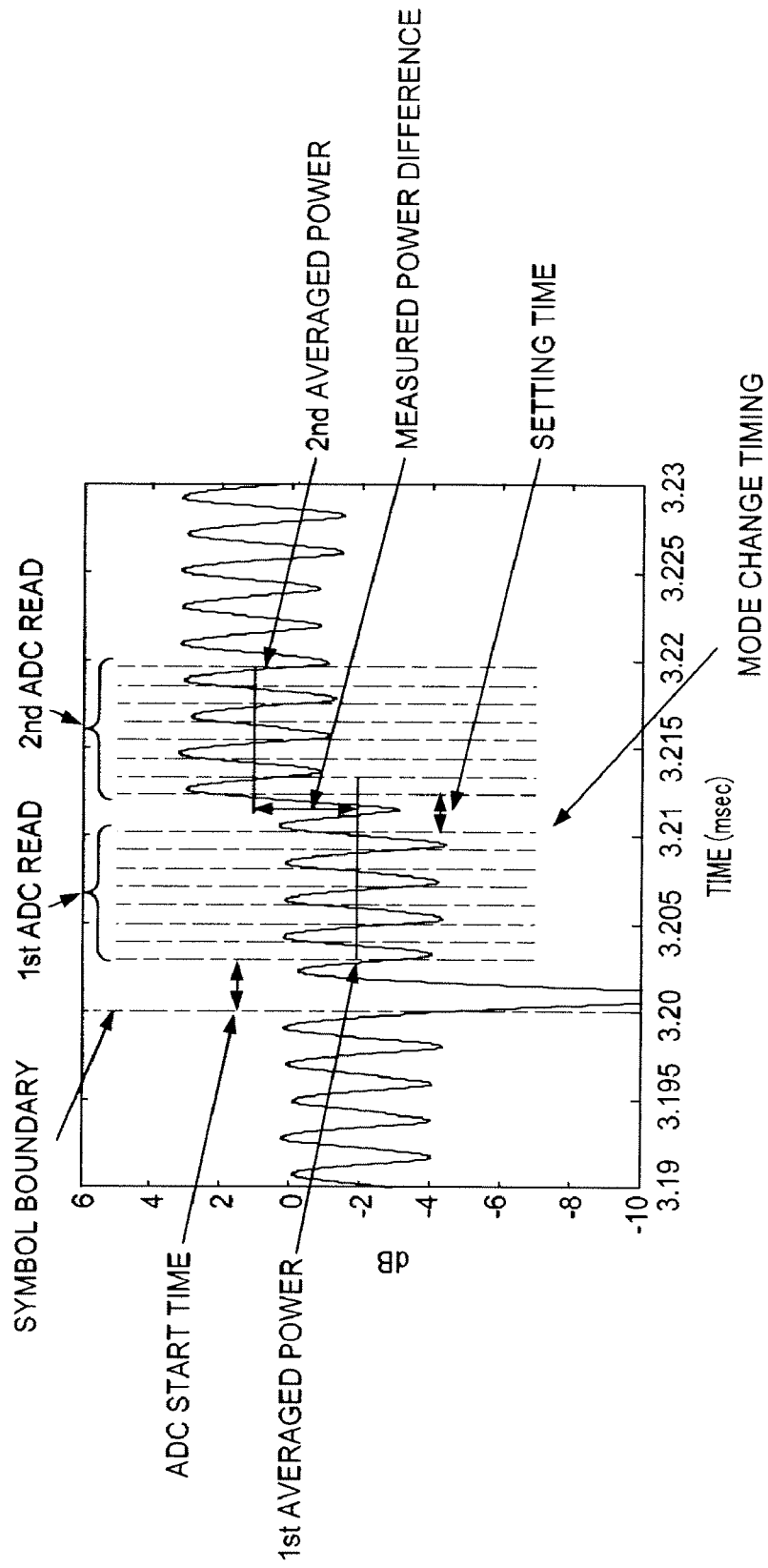
FIG. 9 illustrates a case where power setting flows of FIG. 8 and FIG. 12 are applied to HSDPA communication.

Next, referring to FIG. 9, a case will be explained as an example where the power setting flows shown in FIG. 8 and FIG. 12 are applied to HSDPA communication. FIG. 9 shows a case where, in step S203, a mode change is identified prior to 3.2 msec, which is the power adjustment reference time.

First, in HSPDA communication, there are restrictive requirements that power adjustment be performed within (in 25 μsec before and after) a certain period of time (hereinafter referred to as a "power adjustment tolerance period" as appropriate) from the power adjustment reference time based on a transmission power control signal after the transmission power control signal is received. Further, the set error for transmission power is within 0.5 dB (upon 1 dB power change) from set target $P'_{Tar\_Set}$. In FIG. 9, the symbol boundary at 3.2 msec is the power adjustment reference time, and so power adjustment needs to be completed between 3.175 msec and 3.225 msec.

As shown in FIG. 9, in the period (hereinafter referred to as the "first power adjustment period" as appropriate) between the power adjustment reference time (i.e. the center of the "power adjustment tolerance period") and the time when mode is changed (i.e. the mode change timing in FIG. 9), ADC 109 performs the first sampling processing (matching with step S205 to step S209) avoiding peaks (which is "1st ADC read" in FIG. 10).

Further, in the power adjustment tolerance period (hereinafter referred to as the "second power adjustment period" as appropriate) after the time when mode is changed, ADC 109 performs the second sampling processing (matching with step S213 to step S217) of output of LPF 108 after the first power adjustment (which is "2nd ADC read" in FIG. 10).

Here, ADC 109 samples a filtered signal in mode before change and samples a filtered signal in mode after change at the same phase as the filtered signal in mode before change. That is, the sampling signal in the "first power adjustment period," that is, the sampling signal before mode is changed, and the sampling signal in the "second power adjustment period," that is, the sampling signal after mode is changed, are sampled at the same phase. By this means, the drift frequency of the filtered signal does not change before and after the mode change, so that, by performing sampling at the same phase, it is possible to obtain sampling signals of the same condition before and after the mode change, from the filtered signal waveform.

Further, ADC 109 performs sampling at the sampling frequency of 960 kHz, which is equivalent to the above-mentioned four chip period, both in the first power adjustment period and in the second power adjustment period. By this means, the frequency of the filtered signal waveform results from the fundamental frequency (i.e. the fundamental period) of the spread modulated signal resulting from the pattern of the spreading code, so that, for example, by performing sampling as shown in FIG. 9 at 960 kHz, which is twice the fundamental frequency, it is possible to obtain samples of the same condition in amplitude directions with respect to a sample average value determined later. Further, the sampling frequency is not limited to 960 kHz and may be set to any frequency of integral multiples of the fundamental frequency of the spread modulated signal resulting from the pattern of the spreading code (in other words, the sampling frequency may be an integral fraction of the fundamental period of the spread modulated signal resulting from the pattern of the spreading code).

Further, an interval of integral multiples of the fundamental period of the spread modulated signal resulting from the pattern of the spreading code is provided between the first sampling timings of modes at ADC 109. By this means, the phases of the first sampling signals before and after the mode change become the same reliably.

Then, voltage value $P_{Cur,k}$ measured in the first power adjustment period is averaged by transmission power control section 107, and average value $P_{Cur}$ (which is first average power in FIG. 9) is determined.

Next, the mode is changed at the mode change timing (matching with step S211 or step S311), and transmission power control section 107 sends out a set of scales at the setting time such that target voltage $P_{Tar\_Set}=P_{Cur}+\Delta P$, to amplitude control circuit 104 and variable amplifier 105, thereby performing transmission power adjustment.

Then, voltage value $P_{Tar,k}$ measured in the second power adjustment period is averaged by transmission power control section 107, and average value $P_{Tar}$ (which is second average power in FIG. 9) is determined.

Then, transmission power control section 107 sends out of set of scales such that $P'=P_{Tar\_set}+(P_{Cur}+\Delta P-P_{Tar})$, to amplitude control circuit 104 and variable amplifier 105, thereby performing transmission power adjustment. This concludes transmission power adjustment. In this way, transmission power control is performed based on information reflecting the current situation, that is, sampling signals immediately before and after the mode change, so that it is possible to improve the accuracy of transmission power control.

In this way, according to this embodiment, polar modulation transmitter 100 has detector 106 that detects output power of PA 103, LPF 108 that performs waveform shaping of the detection result of detector 106, ADC 109 that obtains output power data for each mode by sampling filtered signals in compressed mode and sampling filtered signals in uncompressed mode at the same phase as the filtered signals in compressed mode, and transmission power control section 107 that controls output power of PA 103 upon a mode change based on output power data for each mode obtained at ADC 109.

By this means, sampling signals before and after receiving the influence of power output drift due to the mode change can be obtained, and transmission power can be controlled by adjusting output power of PA 103 upon the mode change based on these sampling signals before and after the mode change, so that it is possible to control transmission power accurately. Further, the phases for sampling signals before and after the mode change are the same, so that it is possible to obtain sampling signals of the same condition before and after the mode change from the filtered signal waveforms. In such feedback control based on sampling signals before and after the mode change, even if drift components remain in filtered signals, its influence can be ignored and the time constant for the low-pass filter needs not to be set greater, so that it is possible to estimate and control transmission power with high speed and with a high degree of accuracy.

Further, polar modulation transmitter 100 transmits spread modulated signals spread by spreading codes, and ADC 109 starts sampling from the same phase the filtered signals in compressed mode and the filtered signals in uncompressed mode at the sampling frequency equal to the fundamental frequency of the spread modulated signals resulting from patterns of spreading codes.

By this means, the frequency in the filtered signal waveform results from the fundamental frequency (i.e. the fundamental period) of the spread modulated signal resulting from the pattern of the spreading code, so that, by performing sampling at the sampling frequency equal to the fundamental frequency, it is possible to obtain samples of the same condition in amplitude directions with respect to a sampling signal average value in each mode. In such feedback control based on sampling signals before and after the mode change, even if drift components remain in the filtered signals, its influence can be ignored and the time constant for the low-pass filter needs not to be set greater, so that it is possible to estimate and control transmission power with high speed and with a high degree of accuracy. Further, the sampling frequency may be integral multiples of the fundamental frequency. Particularly, in HSDPA communication, three frequencies 480 kHz, 960 kHz and 8 (no drift) are provided as drift characteristics of filtered signals matching with chip rates of spreading codes. The sampling frequency of an ADC supporting all of these is 960 kHz. Accordingly, in HSDPA communication, the sampling frequency is preferably 960 kHz.

Polar modulation transmitter 100 transmits spread modulated signals spread by spreading codes, and an interval of integral multiples of the fundamental period of the spread modulated signals resulting from the patterns of the spreading codes is provided between the first sampling timings of modes at ADC 109.

By this means, the phases for the first sampling signals before and after the mode change become the same reliably.

Embodiment 2

Polar modulation transmitter 100 according to Embodiment 1 has been described above with reference to an example where the target voltage for transmission power is adjusted based on sampling signals sampled in a first power adjustment period and sampling signals sampled in a second power adjustment period. That is, in Embodiment 1, the target voltage is adjusted in one step.

By contrast with this, with Embodiment 2, a "third power adjustment period" is provided between the first power adjustment period and the second power adjustment period for rough adjustment of the target value.

Figure 13:
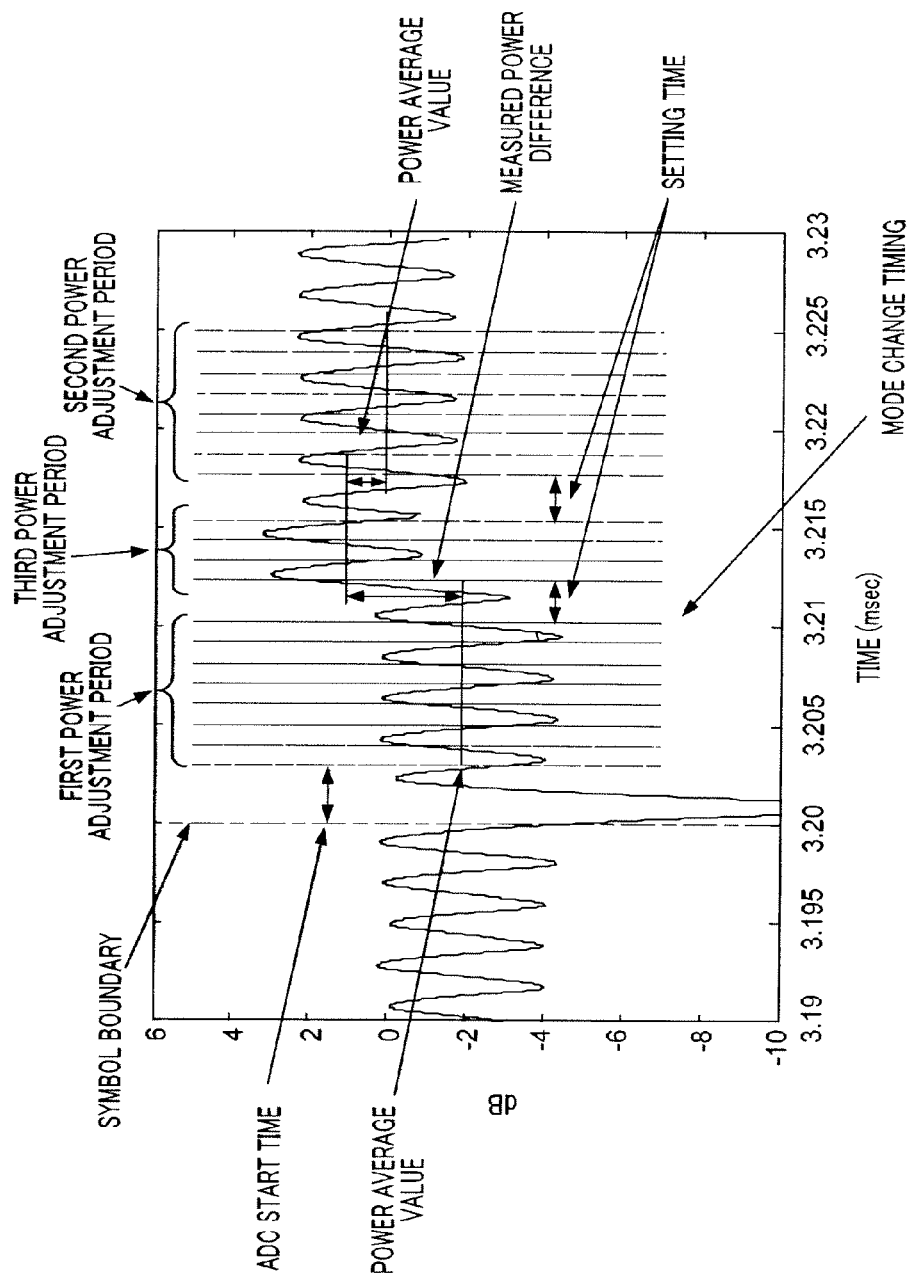
FIG. 13 illustrates power setting processing according to Embodiment 2.

Accordingly, when it is decided that mode is changed, as shown in FIG. 13, output of low-pass filter 108 is sampled in the first power adjustment period, mode is changed at the setting time and output of low-pass filter 108 is sampled in the third power adjustment period.

Next, the difference between the first target voltage ($P_{Tar\_Set}=P_{Cur}+\Delta P$) after the mode change and the average sample power value ($P_{cur}$) in the third power adjustment period is determined. A second target voltage is determined by adjusting the first target voltage based on this difference (matching with the above rough adjustment).

Here, as in the first adjustment period and the second adjustment period, in the third power adjustment period, ADC 109 starts sampling at the same phase as in the other power adjustment periods at the sampling frequency of integral multiples of the fundamental frequency.

In this case, the number of samples sampled in the third power adjustment period is set smaller than the number of samples sampled in the first power adjustment period and the second power adjustment period. Therefore, although the accuracy of the average sample power value ($P_{Cur}$) in the third power adjustment period may deteriorate compared to the accuracy in the other power adjustment periods, it is possible to obtain sufficient accuracy for rough adjustment of the target voltage.

Next, output of low-pass filter 108 is sampled in the second power adjustment period. The difference between the second target voltage and the average sample power value in the second power adjustment period is determined. The final target voltage is determined by adjusting (i.e. fine adjustment) the second target voltage based on this difference.

In this way, according to this embodiment, a third power adjustment period where the number of samples is smaller than in the first and second power adjustment periods is provided between the first power adjustment period and the second power adjustment period.

By this means, it is possible to perform rough adjustment before fine adjustment of the target voltage. As a result, it is possible to improve the accuracy of fine adjustment of the target voltage. Further, particularly, although power control must be completed in a short period according to 3GPP, it is possible to fulfill this restrictive time limit and improve the accuracy of power control.

Further, although the number of samples in the third power adjustment period is set smaller than in the first and second power adjustment periods, this embodiment is not limited to this. If the response time of detector 106 causes no problem in system operation, the number of samples in the third power adjustment period can be set the same as in the first and second power adjustment periods. In this case, improvement in the accuracy of target voltage adjustment is anticipated.

Embodiment 3

Figure 14:
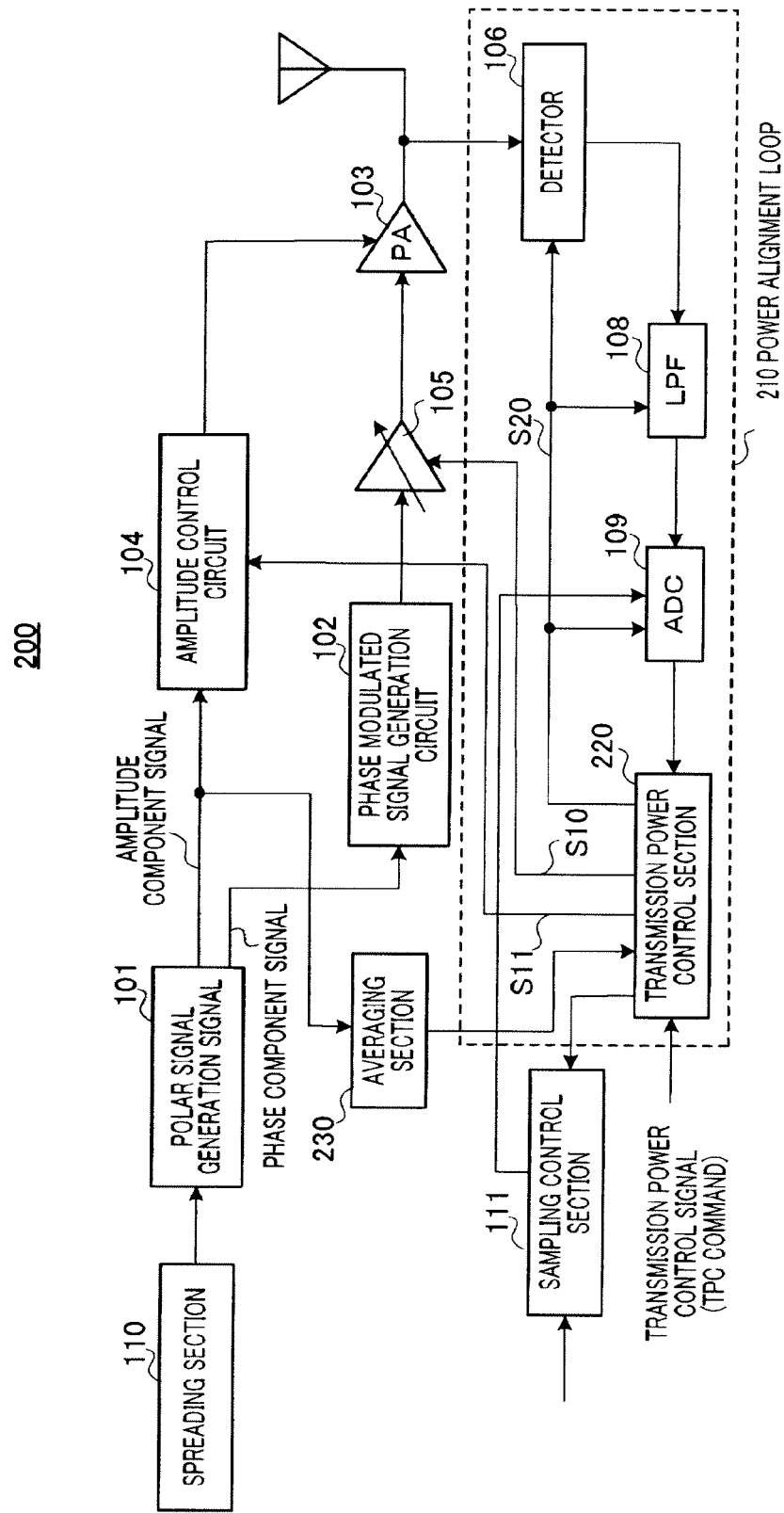
FIG. 14 is a block diagram showing the configuration of the polar modulation transmitter according to Embodiment 3.

FIG. 14 shows a configuration of polar modulation transmitter 200 according to Embodiment 3 of the present invention. Further, the same components as in FIG. 6 will be assigned the same reference numerals and repetition of description will be omitted.

Polar modulation transmitter 200 of FIG. 14 has power alignment loop 210 that has transmission power control section 220 and averaging section 230.

Averaging section 230 averages amplitude component signals outputted from polar signal generation circuit 101. Averaging section 230 detects the average output power value of amplitude component signals outputted from polar signal generation circuit 101 in a predetermined period.

Transmission power control section 220 receives an input of the detection result of the average value of amplitude component signals from averaging section 230.

Based on the amount of drift in the average output power value of PA 103 and the amount of drift in the average output power value of amplitude component signals, transmission power control section 220 finds a power estimation value which eliminates residual drift components resulting from spreading modulation from the average output power value of PA 103. Then, transmission power control section 220 controls transmission power by determining the set target transmission power value for transmission power of polar modulation transmitter 200 based on the transmission power control signal, the amount of drift in the average output power value of PA 103 which eliminates residual drift components resulting from spreading modulation, and the amount of drift in the average output power value of amplitude component signals.

The relationship between the average output power value of PA 103 and the average output power value of amplitude component signals, and the method for determining power estimation values which eliminate residual drift components resulting from spreading modulation from the average output power value of PA 103 will be explained later.

After having determined the set target value for transmission power, transmission power control section 230 controls the power supply voltage level of PA 103 and the input signal (i.e. RF phase modulated signal) level of PA 103 by sending out amplitude path scaling coefficient S11 to amplitude control circuit 104 and phase path scaling coefficient S10 to variable amplifier 105.

Transmission power control section 220 calculates final scaling coefficients S10 and S11 using original values of scaling coefficients obtained by referring to a table using the transmission power control signals (for example, TPC commands) as addresses, and correction values of scaling coefficients obtained from the power estimation values which eliminate residual drift components resulting from spreading modulation.

Polar modulation transmitter 200 according to this embodiment finds the power estimation value which eliminates residual drift components resulting from spreading modulation from the average output power value of PA 103, based on the amount of drift in the average output power of PA 103 and the amount of drift in the average output power value of amplitude component signals, determines the set target value for transmission power based on this power estimation value and the transmission power control signal and controls transmission power, so that it is possible to eliminate the influence of residual drift components and control transmission power, and, consequently, improve the accuracy of transmission power control.

Next, how residual drift components are eliminated will be explained in detail.

First, the relationship between the average output power value of PA 103 and the average output power value of amplitude component signals will be explained with reference to FIG. 15 and FIG. 16.

Figure 15:
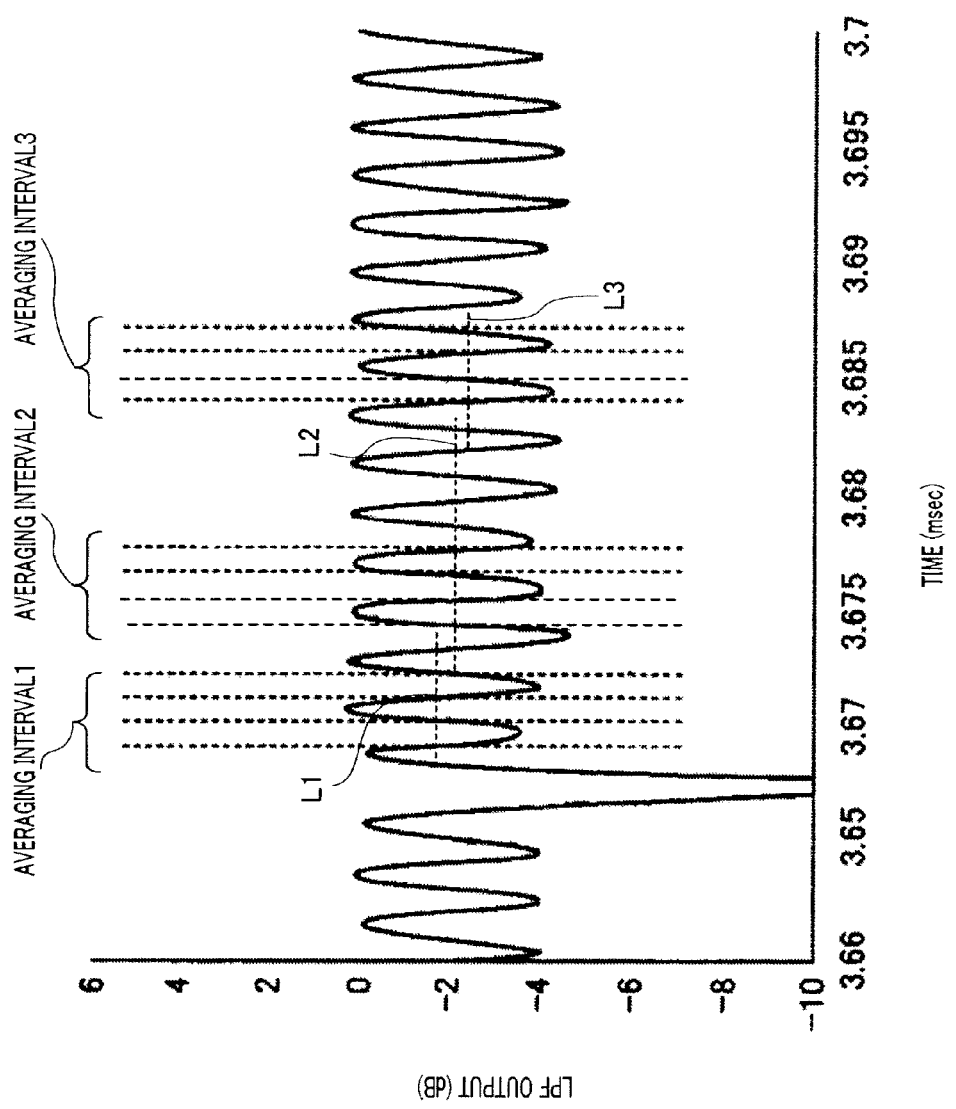
FIG. 15 illustrates drift in an ADC output power average value.

FIG. 15 shows the relationship between the output waveform (which is the solid line in FIG. 15) of LPF 108, the sampling timings (which is vertical dotted lines in FIG. 15) of ADC 109 and the average sampling values (which is horizontal dotted lines in FIG. 15) in a predetermined period. FIG. 16 shows the power waveforms of amplitude component signals (i.e. AM path signal) and short-term average values. FIG. 15 and FIG. 16 show waveforms when there is no influence due to transmission power changes and device characteristics.

In this case, although the scale difference and noise influence occurs depending on the circuit configuration of detector 106, output of detector 106 is substantially the same as the waveform pattern of amplitude component signals (i.e. AM path signal) shown by solid lines in FIG. 9. To be more specific, the output voltage of detector 106 drifts periodically between near 0 [V] and near 0.35 [V]. The periodicity of output voltage drift of this detector 106 results from the fundamental period of the spread modulated signal resulting from the pattern of the spreading code used at spreading section 110. If the fundamental period of the spreading code shows, for example, an eight chip period, the period of output voltage drift of detector 106 shows an eight chip period (that is, values are near 0 [V] for a four chip period and values are near 0.35 [V] for the next four chip period) or a four chip period, which is half of an eight chip period. Further, if the fundamental period of the spreading code shows, for example, a four chip period, the period of output voltage drift in detector 106 shows a four chip period (that is, values are near 0 [V] for a two chip period and values are near 0.35 [V] for the next two chip period) or a two chip period, which is half of a four chip period.

As shown in FIG. 15, an output signal of LPF 108 shows drift of around 4 dB width, and shows drift of 10 dB or greater near 3.66 msec (i.e. symbol boundary) in FIG. 15. This drift deteriorates the accuracy of power control, and so these drift components are eliminated in this embodiment.

Transmission power control section 220 of this embodiment averages sampling values at time positions avoiding timings of significant drift of around 3.66 msec (i.e. symbol boundary) in FIG. 15. In practice, transmission power control section 220 does not perform averaging until a settling period passes from the symbol boundary (i.e. the period until output of LPF 108 becomes stable), and performs averaging using the LPF output after the settling period passes.

Further, the sampling period of ADC 109 is set so as to match with the above drift of around 4 dB. Transmission power control section 220 is able to eliminate the influence of significant drift near the symbol boundaries and drift of around 4 dB width by averaging ADC values of a number of samples at positions not including the symbol boundaries.

However, transmission power control section 220 is not able to eliminate drift components of much lower frequencies. In FIG. 15, the vertical dotted lines show sampling timings in periods of integral multiples of drift of around 4 dB (i.e. 960 kHz), and the horizontal dotted lines show average values of four samples. Average value L1 in averaging interval 1, average value L2 in averaging interval 2 and average value L3 in averaging interval 3 are all different, which shows that drift components are not yet eliminated. These little drift components are referred to as "residual drift components." The inventors focus upon amplitude component signals to eliminate residual drift components. FIG. 16 shows amplitude component signals (AM path signal), the horizontal axis shows time and the vertical axis shows instantaneous power. Values obtained by averaging amplitude component signals in averaging intervals 1, 2 and 3 matching with averaging intervals 1, 2 and 3 of FIG. 15 are shown by horizontal dotted lines to show clearly whether or not the above residual drift components are included in these amplitude component signals.

Figure 17:
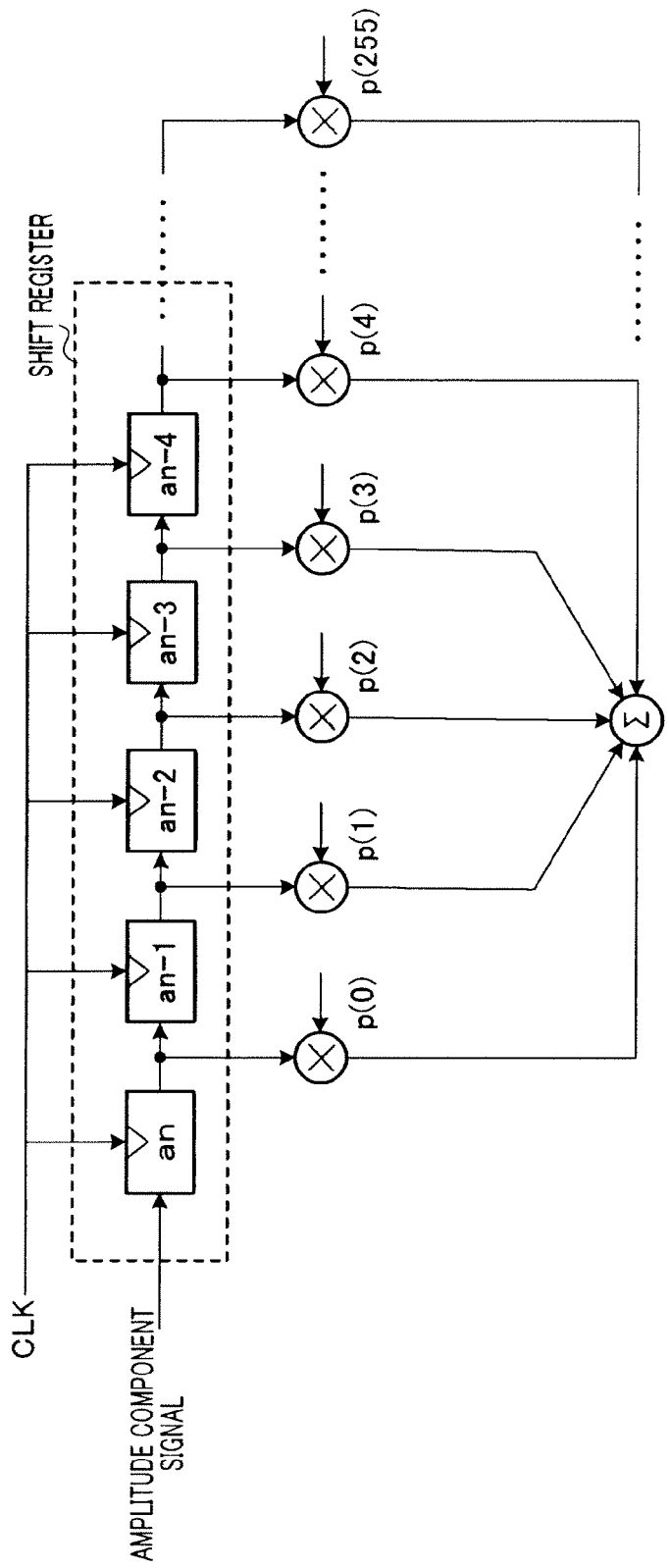
FIG. 17 is a connection diagram showing an FIR filter as a configuration example of an averaging section.

Here, any circuit may be used to average amplitude component signals, and, for example, an FIR filter, IIR filter or adder for performing addition only in required intervals may be used. For example, the FIR filter shown in FIG. 17 and the IIR filter shown in FIG. 18 may be used as averaging section 230. FIG. 17 shows an example where an FIR filter is used, whereby the number of taps is two hundred fifty six and all tap coefficients p(0) to p(255) are set to one.

Here, the number of taps may be determined from the sampling frequency for amplitude component signals, the sampling period in ADC 109 and the number of averaged samples in ADC 109, to match with the interval of four samples in ADC 109 explained in FIG. 15. As an example, when the sampling frequency for the amplitude component signals is 61.44 MHz, the sampling period in ADC 109 is 960 kHz and the number of averaged samples in ADC 109 is four, the number of taps at the FIR filter is determined by the following equation.

$$
\begin{aligned}
&(\text{Number of taps at the } \textit{FIR}) = \\
&\quad (\text{number of averaged samples in the } \textit{ADC}) \times \\
&\quad (\text{sampling frequency for amplitude component signals}) / \\
&\quad (\text{sampling frequency of the } \textit{ADC}) = \\
&\quad 4 \times 61.44 \text{ MHz}/960 \text{ kHz} = 256
\end{aligned}
$$

Further, the sampling frequency for amplitude component signals is 61.44 MHz, and so, when the number of taps at FIR filter is two hundred fifty six, clock frequency CLK of the FIR filter may be set to 61.44 MHz.

By the way, the multiplier for the FIR filter occupies a large setup area on the substrate, and so reducing the number of taps is a common object for ones skilled in the art. However, the filter coefficients multiplied at the multiplier may all be set to one, so that the FIR filter may be configured with adders. For this reason, even if the number of taps increases, the setup area does not increase significantly.

Figure 18:
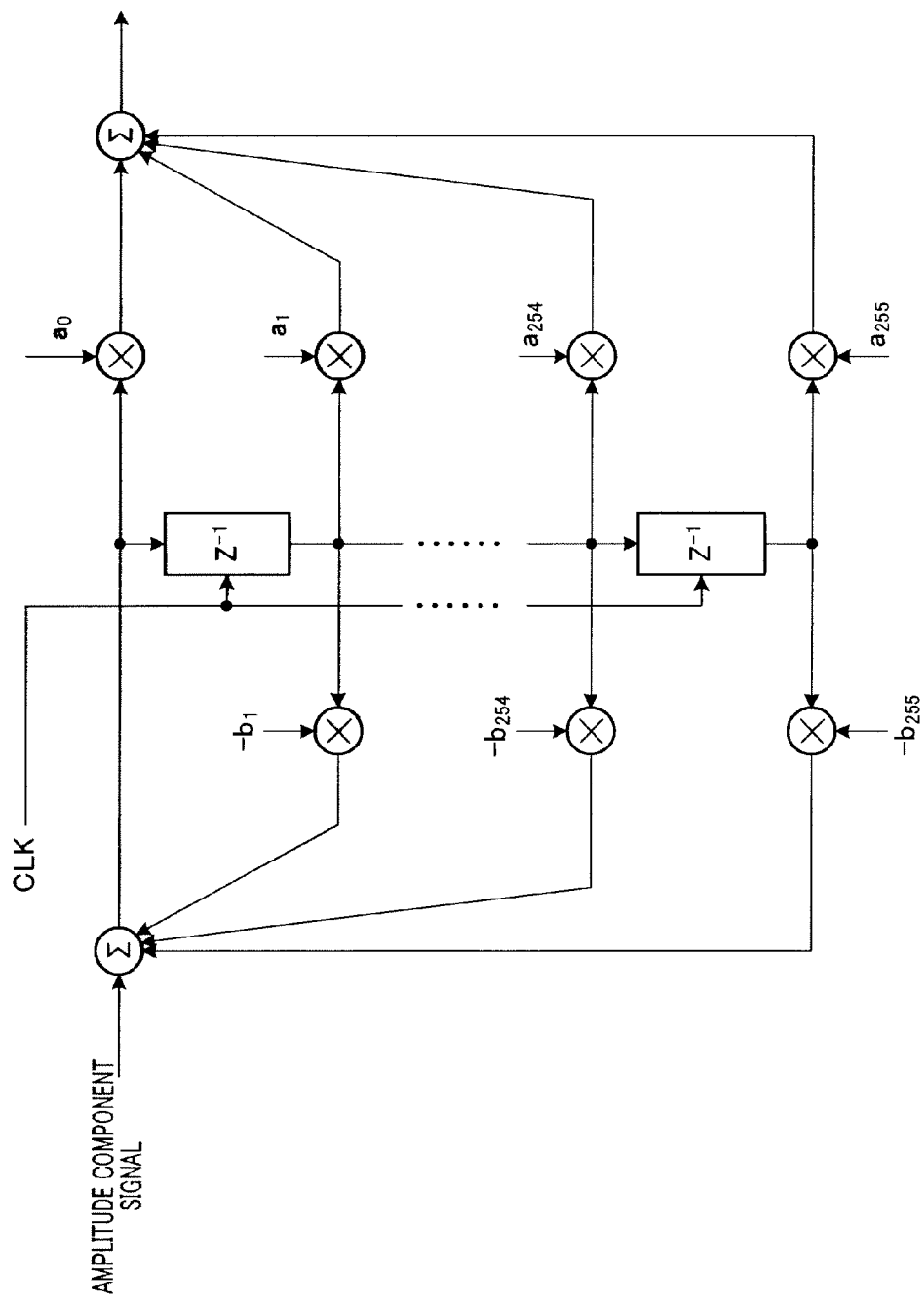
FIG. 18 is a connection diagram showing an IIR filter as a configuration example of the averaging section.

FIG. 18 shows a configuration example of using an IIR filter instead of the FIR filter of FIG. 17. In FIG. 18, for example, clock frequency CLK may be set to the same 61.44 MHz similar to the sampling frequency for the amplitude component signal as in FIG. 17, feedforward coefficients a0 to a255 may be set to one, and feedback coefficients b1 to b255 may be set to 255/256. Here, these setting values are examples and are not limited to these.

Figure 16:
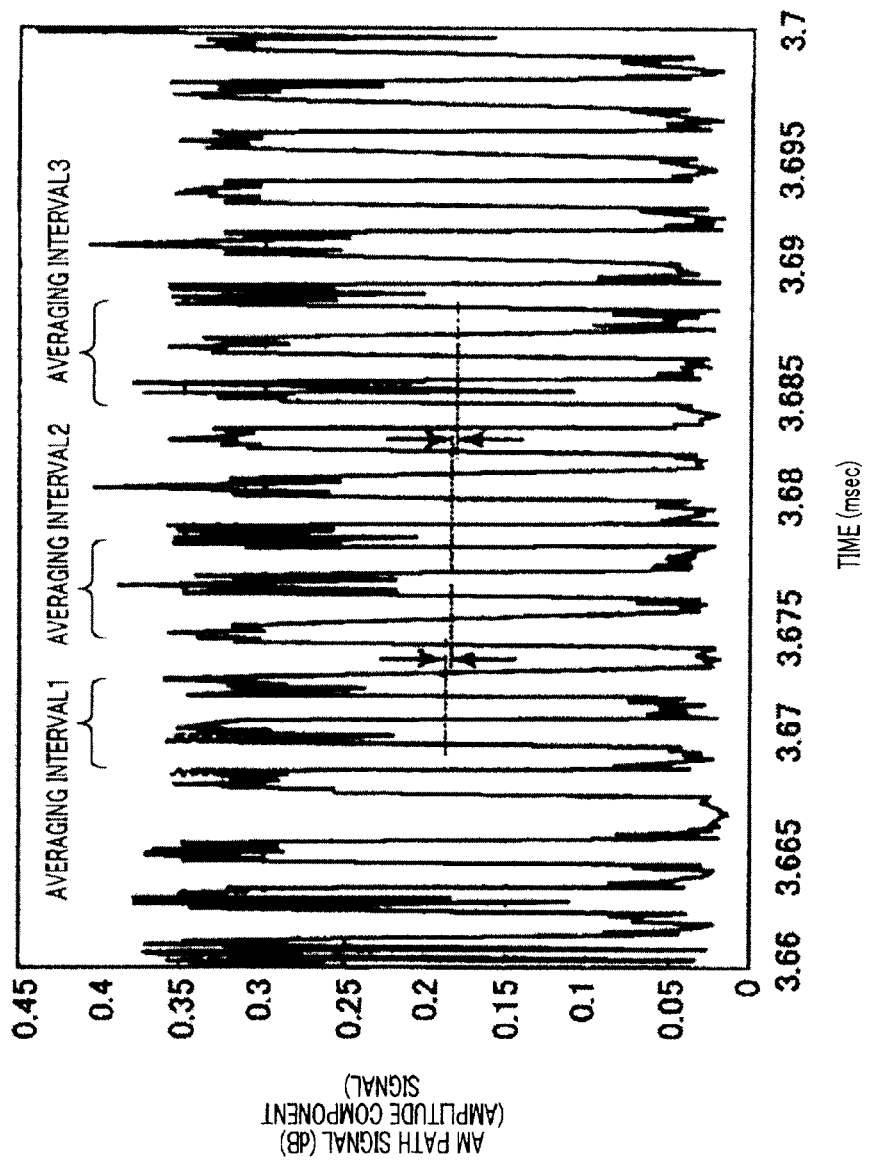
FIG. 16 illustrates drift in an average output power value of amplitude component signals.

As shown in FIG. 16, average values in averaging intervals 1, 2 and 3 show little drift between averaging intervals 1, 2 and 3. FIG. 16 shows a waveform free of such influences as device variations, and so drift in the average value results from drift components included in amplitude component signals themselves. These drift components include wideband drift components in amplitude component signals after spreading modulation depending on a spreading pattern or a spreading code gain factor, and drift in the low-frequency component cannot be eliminated by short-term averaging. Consequently, even if there is no influence due to device characteristics, the average output power value of PA 103 within a predetermined period after the LPF drifts depending on the averaging interval as shown in FIG. 15.

Correlation between residual drift components included in the above average value after the LPF and residual drift components included in amplitude component signals will be explained later. Although characteristics of specific symbols are focused upon in the above description, characteristics including characteristics of other symbols over one frame will be focused upon, and residual drift components included in the average value after the LPF and residual drift components included in amplitude component signals will be compared.

Figure 19:
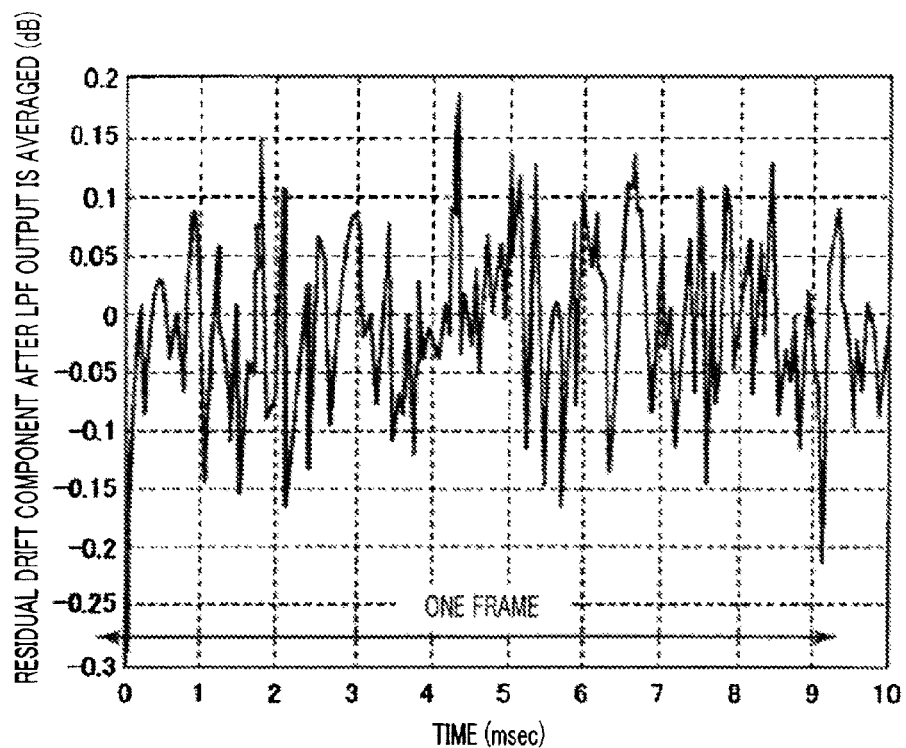
FIG. 19 shows how the average output power value of a PA drifts over one frame in a specific interval of each symbol.

In FIG. 19, the residual drift components between average value L1 of LPF outputs of symbols in the first ADC sampling interval (for example, averaging interval 1 of FIG. 15) and average value L2 in the second ADC sampling interval (for example, averaging interval 2 of FIG. 15) are extracted over one frame, and the horizontal axis is the symbol position in one frame and the vertical axis is the magnitude of residual drift components.

Figure 20:
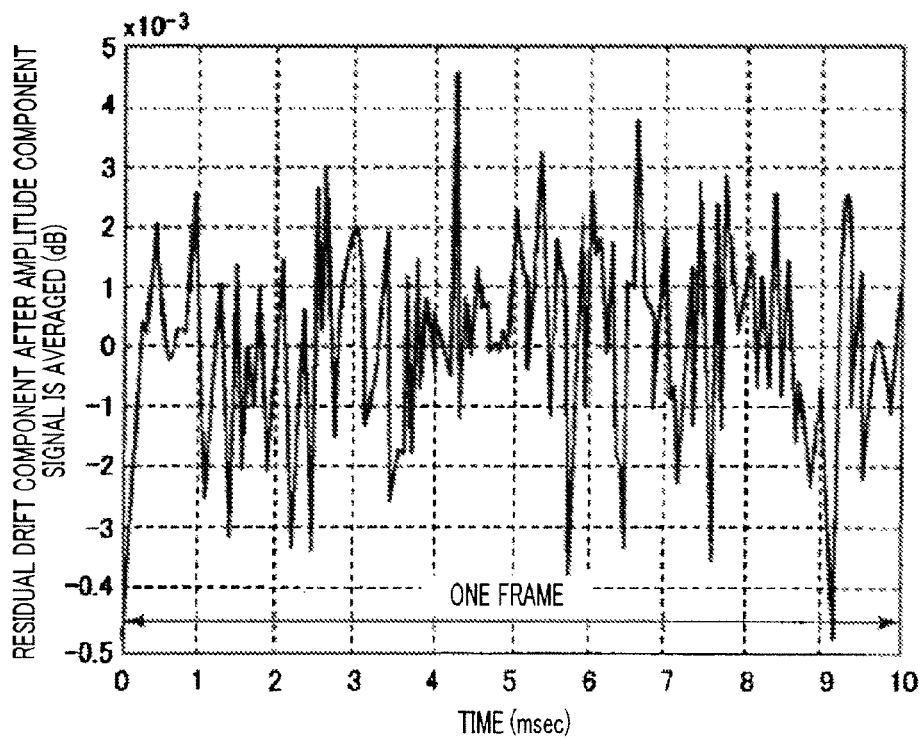
FIG. 20 shows how the average output power value of amplitude component signals drifts over one frame in a specific interval of each symbol.

In FIG. 20, the residual drift components between the average value of amplitude component signals of symbols in the first averaging interval (for example, averaging interval 1 of FIG. 9) and the average value in the second averaging interval (for example, averaging interval 2 of FIG. 15) are extracted over one frame, and the horizontal axis is the symbol position in one frame and the vertical axis is the magnitude of the residual drift components.

In these figures, residual drift components included in the average value after the LPF and residual drift components included in amplitude component signals show similar characteristics at the same symbol positions, and so correlation is anticipated to hold between the residual drift components.

Figure 21:
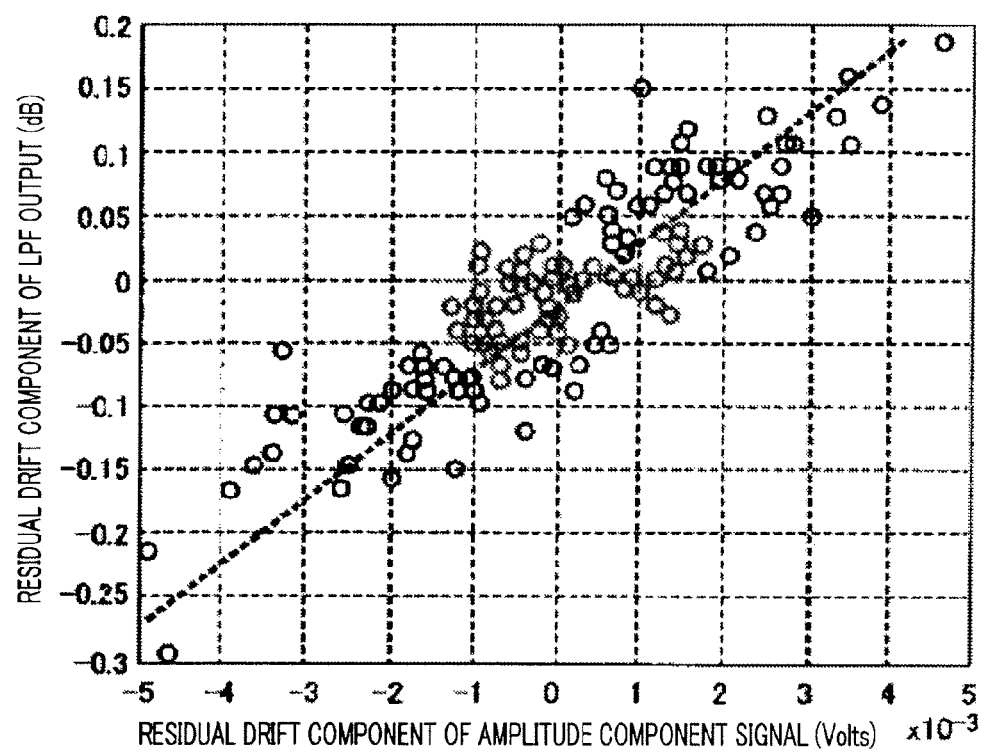
FIG. 21 illustrates correlation between drift in the average value of LPF output waveforms and drift in the average value of amplitude component signals.

In FIG. 21, residual drift components included in the amplitude component signals of symbols are plotted on the horizontal axis and residual drift components included in the average value after the LPF are plotted on the vertical axis over one frame. Here, although the distribution of plots is random if there is no correlation between the residual drift components, plots are distributed in FIG. 21 near the straight line with a certain inclination, and so there is correlation between two residual drift components.

The correlation coefficient in this case is represented by "C," and correlation coefficient C is determined by finding the inclination of the straight line where plots in FIG. 21 approximate a straight line, according to the following equation.

Correlation coefficient C=(the amount of change in residual drift components included in the average value after the LPF)/(the amount of change in residual drift components included in amplitude component signals)

That is, by finding this correlation coefficient C using simulation or a known signal interval, residual drift components (i.e. the difference between average values obtained at averaging section 230) are determined based on amplitude component signals and are multiplied by correlation coefficient C, so that it is possible to estimate residual drift components included in the average value after the LPF.

In this way, it is possible to find a power estimation value which eliminates the influence of residual drift components, by subtracting the estimated value of residual drift components included in the above average value after the LPF from the amount of drift in the average output power value of PA 103.

That is, transmission power control section 220 calculates final scaling coefficients S10 and S11 using original values of scaling coefficients obtained by referring to the table using transmission power control signals as addresses and correction values of scaling coefficients obtained from the result of subtracting a value obtained by multiplying the amount of drift in the average output power value of amplitude component signals by correlation coefficient C, from the amount of drift in the average output power value of PA 103 (that is, the power estimation value which eliminates the residual drift components resulting from spreading modulation).

Figure 22:
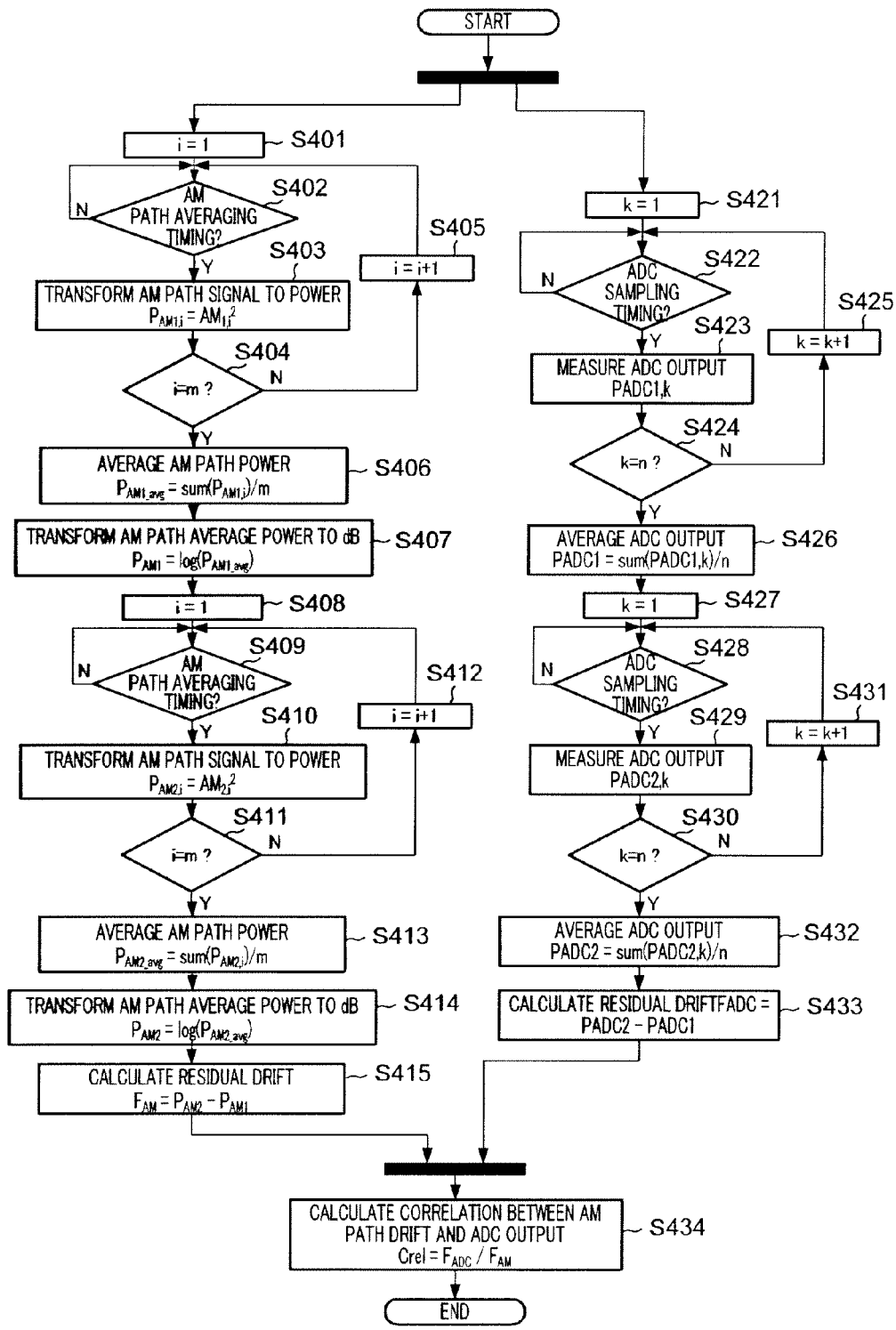
FIG. 22 is a flowchart illustrating a calculation method of calculating correlation between drift in the average value of LPF output waveforms and drift in the average value of amplitude component signals.

FIG. 22 is a flowchart showing an example of a method for calculating correlation coefficient C.

In steps S401 through S406, average output power value $P_{AM1\_avg}$ of amplitude component signals (i.e. AM path) outputted from polar signal generation circuit 101 is calculated within a predetermined period, and the output power unit is converted to dB using the equation $\log(P_{AM1\_avg})=P_{AM1}$. Further, in the case of the above example, parameter m in FIG. 22 is set to "256," and parameter n is set to "4."

Similarly, in steps S408 to S413, average output power value $P_{AM2\_avg}$ of amplitude component signals outputted from polar signal generation circuit 101 is calculated, and the output power unit is converted to a logarithm using the equation $\log(P_{AM2\_avg})=P_{AM2}$ in step S414. In step S415, residual drift components $F_{AM}$ of amplitude component signals outputted from polar signal generation circuit 101 are calculated by subtracting $P_{AM1}$ from $P_{AM2}$.

In steps S421 to S426, average value $P_{ADC1}$ of output results of ADC 109 within a predetermined period is measured, and, similarly, in steps S427 to S432, average value $P_{ADC2}$ of output results of ADC 109 within a predetermined period is measured. In step S433, residual drift components $F_{ADC}$ are calculated by subtracting $P_{ADC1}$ from $P_{ADC2}$. In LPF 108 and ADC 109, the output power unit is converted to a logarithm, and so no steps matching with step S407 and step S414 are provided with respect to $P_{ADC1}$ and $P_{ADC2}$, and in step S433, residual drift components $F_{ADC}$ are calculated by subtracting $P_{ADC1}$ from $P_{ADC2}$.

Finally, in step S434, correlation coefficient C is calculated by dividing residual drift components $F_{ADC}$ by residual drift components $F_{AM}$.

With regard to correlation coefficient C, a single common coefficient may be provided for all combinations of gain factors Beta ratio c (Bc), Beta ratio d (Bd), and Beta ratio hs (Bhs) when the DPDCH signal, DPCCH signal, and HS-DPCCH signal forming an HSUPA signal are multiplied by spreading codes, or a plurality of correlation coefficients C may be provided according to the combination of gain factors. It is also possible to change conditions such as the plurality of symbols, the plurality of the combinations of gain factors, or the averaging intervals within symbols, calculate correlation coefficient C under various conditions, and use the average value as correlation coefficient C.

Transmission power control section 220 controls transmission power of polar modulation transmitter 200 based on a transmission power control command, the amount of drift in the average output power value of PA 103, and the amount of drift in the average output power value of amplitude component signals.

Next, the operation of polar modulation transmitter 200 with the above configuration will be explained with reference to FIG. 23.

Figure 23:
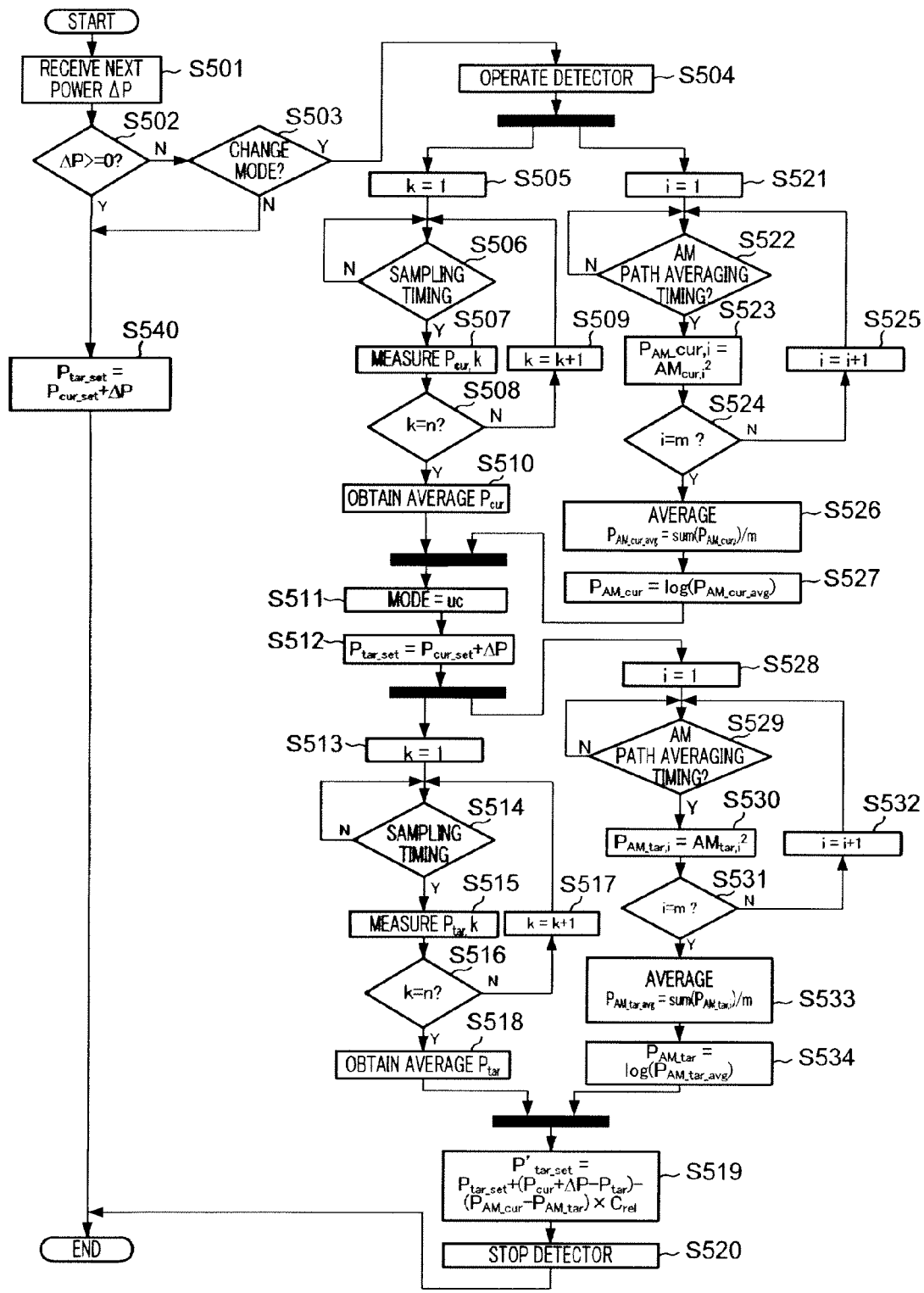
FIG. 23 is a flowchart illustrating the operation of the polar modulation transmitter when current mode is compressed mode.

FIG. 23 is a flowchart illustrating the operation of polar modulation transmitter 200 when current mode is compressed mode. Polar modulation transmitter 200 detects the amount of power drift ΔP designated by a communicating party (not shown) in step S501, then in step S502 decides whether or not the amount of drift ΔP is zero or more, and if the amount of drift ΔP is zero or more (step S502: "YES"), decides that compressed mode can be performed as is, proceeds to step S540, and changes power by ΔP. On the other hand, if the amount of drift ΔP is less than zero in step S502 (step S502: "NO"), polar modulation transmitter 200 decides whether or not mode is changed to uncompressed mode (step S503), and if it is decided that mode is not changed (step S503: "NO"), proceeds to step S540 and changes power by ΔP.

If, on the other hand, it is decided in step S503 that mode is changed to uncompressed mode (step S503: "YES"), transmission power control section 220 decides that feedback control at power alignment loop 210 is necessary, and proceeds to step S504. Polar modulation transmitter 200 turns on power supply for the measurement system in step S504, and proceeds to step S505 and step S521.

In steps S505 to S510, average output power value $P_{Cur}$ of PA 103 in compressed mode is measured, in step S511, mode is changed from compressed mode to uncompressed mode, and, in step S512, power is changed by ΔP.

Then, in steps S513 to S518, output power average value $P_{tar}$ of PA 103 in uncompressed mode is measured.

Meanwhile, in steps S521 to S527, average output power value $P_{AM\_cur}$ of amplitude component signals outputted from polar signal generation circuit 101 in compressed mode period is measured. In step S511, mode is changed from compressed mode to uncompressed mode, and, in step S512, power is changed by ΔP. Then, in steps S528 to S534, average output power value $P_{AM\_tar}$ of amplitude component signals outputted from polar signal generation circuit 101 in uncompressed mode period is measured.

In step S519, transmission power control section 220 performs error correction using $P_{cur}$, $P_{tar}$, $P_{AM\_cur}$, $P_{AM\_tar}$, and correlation coefficient C, and calculates $P'_{tar\_set}$. When error correction ends, power supply for the measurement system is turned off in step S520.

Figure 24:
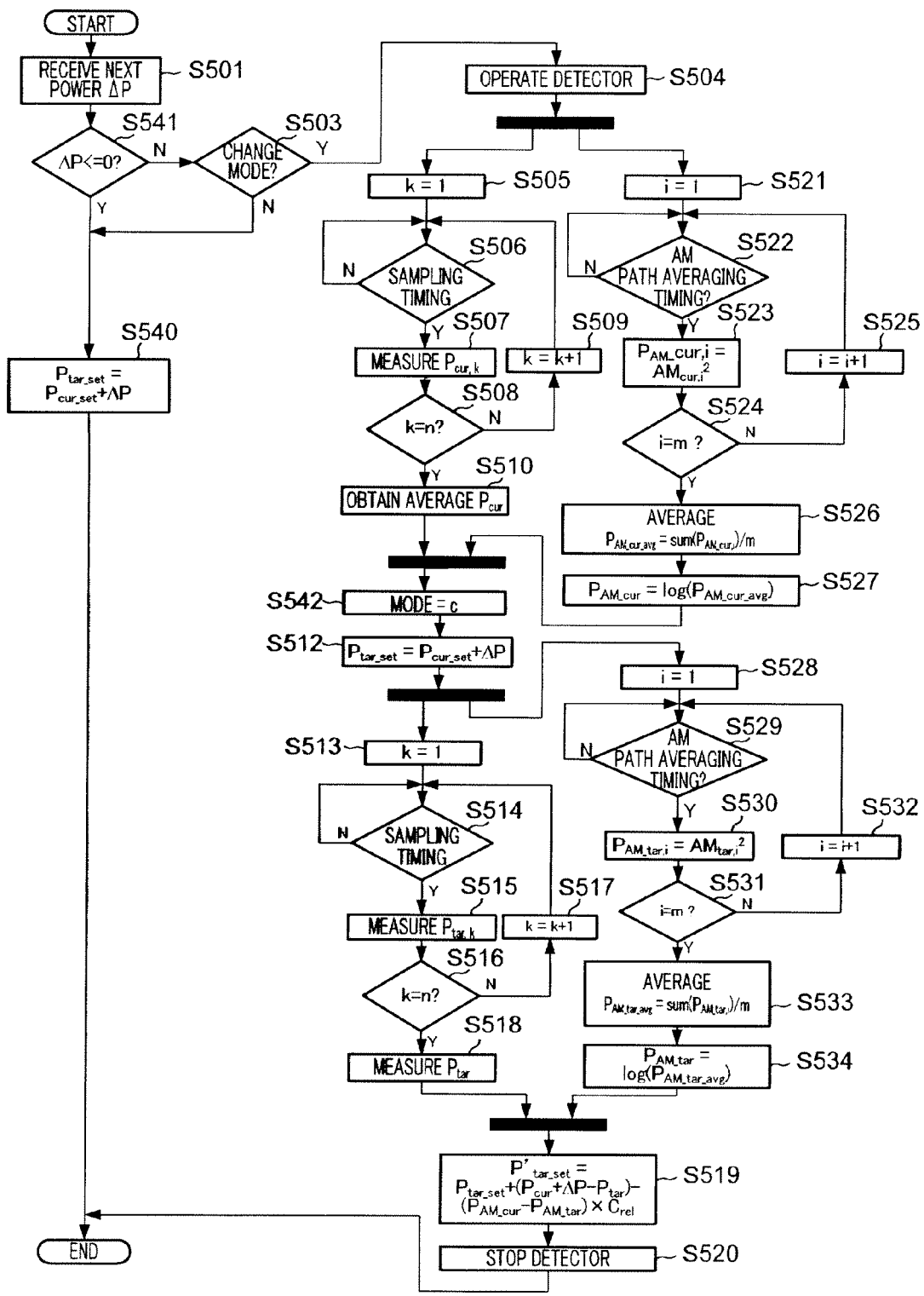
FIG. 24 is a flowchart illustrating the operation of the polar modulation transmitter when current mode is uncompressed mode.

FIG. 24 is a flowchart illustrating the operation of polar modulation transmitter 200 when current mode is uncompressed mode. In FIG. 24, the same steps as in FIG. 23 will be assigned the same reference numbers and repetition of description will be omitted. In FIG. 24, it is decided whether or not the amount of drift ΔP is zero or less in step S541 instead of step S502 of FIG. 23, and mode is changed from uncompressed mode to compressed mode in step S542 instead of step S511 of FIG. 23.

Although, if a channel is focused upon, transmission power is changed in slot units, transmission power is changed in symbol units depending on the relationship between slot timings between channels, and so the symbol boundary means a timing when transmission power is likely to be changed.

Here, as in Embodiment 1, if power control is performed based only on LPF output, with a restrictive β condition, residual drift components remain in LPF output and the accuracy of power control is likely to deteriorate. However, according to the configuration of this embodiment, residual drift components can be determined and eliminated irrespective of the β condition, and so the accuracy of power control does not deteriorate. Here, although a case has been explained with the β condition as an example, the configuration of this embodiment is effective in many cases where residual drift components change according to the modulation condition.

As explained above, according to this embodiment, by providing averaging section 230 that detects an average power value of amplitude component signals, and controlling transmission power based on the amount of drift in the average output power value of PA 103 and the amount of drift in the average power value of amplitude component signals, when residual drift components are included in the average output power value of PA 103, the influence of residual drift components can be eliminated and transmission power can be controlled, so that it is possible to improve the accuracy of transmission power control. That is, deterioration of power estimation accuracy resulting from residual drift components can be reduced, so that it is possible to fulfill the restrictive requirement that the difference between transmission power be within, for example, the range of ±0.5 dB.

Also, transmission power control section 220 sets in advance correlation coefficient C that shows the ratio of residual drift components included in the average output power value of PA 103 to residual drift components included in the average output power value of amplitude component signals, and finds residual drift components by multiplying the average output power value of the amplitude component signals by correlation coefficient C. Then, the power estimation value is determined by subtracting the determined residual drift components from the average output power value of PA 103 and transmission power is controlled based on this power estimation value, so that it is possible to eliminate the influence of residual drift components included in the average output power value of PA 103 and securely improve the accuracy of transmission power control.

Further, by using low-pass filters or integrators with the same time constant for LPF 108 that detects an average output power value of PA 103 and averaging section 230 that detects an average output power value of amplitude component signals, residual drift components included in the average output power value of PA 103 and residual drift components included in the average output power value of the amplitude component signals can be coordinated reliably.

This is because the cutoff frequency of the signal that is detected is determined based on the time constant for LPF 108 that detects the average output power value of PA 103 and the time constant for the low-pass filters or the integrators used in averaging section 230, and the accuracy of estimating residual drift components deteriorates due to the difference between these time constants. By the way, the tolerance for the time constant differs depending on the range of the accuracy of device design and temperature variations, but is preferably within a range of around ±10%.

The present invention is not limited to the above explained embodiments, and various variations and modifications may be possible without departing from the scope of the present invention.

What is claimed is:

1. A transmission apparatus with a mode of operating a power amplifier in a compressed mode and a mode of operating the power amplifier in an uncompressed mode, the apparatus comprising:
   a filter that performs waveform shaping of an output of the power amplifier;
   an analogue to digital converting section that obtains output power data for each mode by sampling a filtered signal in compressed mode and sampling a filtered signal in uncompressed mode at a same phase as the filtered signal in compressed mode; and
   a transmission power controlling section that controls output power of the power amplifier upon a mode change, based on the output power data for each mode obtained in the analogue to digital converting section, wherein:
   the transmission apparatus transmits a spread modulated signal spread by a spreading code; and
   the analogue to digital converting section starts sampling the filtered signal in compressed mode and the filtered signal in uncompressed mode from the same phase at a sampling frequency equal to a fundamental frequency of the spread modulated signal resulting from a pattern of the spreading code.

2. The transmission apparatus according to claim 1, wherein the transmission apparatus transmits a high speed downlink packet access signal.

3. A polar modulation transmitter comprising the transmission apparatus according to claim 1.

4. The transmission apparatus according to claim 1, wherein the analog to digital converting section performs the sampling at a sampling frequency of 960 kHz.

5. A transmission apparatus with a mode of operating a power amplifier in a compressed mode and a mode of operating the power amplifier in an uncompressed mode, the apparatus comprising:
   a filter that performs waveform shaping of an output of the power amplifier;
   an analogue to digital converting section that obtains output power data for each mode by sampling a filtered signal in compressed mode and sampling a filtered signal in uncompressed mode at a same phase as the filtered signal in compressed mode; and
   a transmission power controlling section that controls output power of the power amplifier upon a mode change, based on the output power data for each mode obtained in the analogue to digital converting section, wherein:
   the transmission apparatus transmits a spread modulated signal spread by a spreading code; and
   the analogue to digital converting section starts sampling the filtered signal in compressed mode and the filtered signal in uncompressed mode from the same phase at a sampling frequency of integral multiples of a fundamental frequency of the spread modulated signal resulting from a pattern of the spreading code.

6. A transmission apparatus with a mode of operating a power amplifier in a compressed mode and a mode of operating the power amplifier in an uncompressed mode, the apparatus comprising:
   a filter that performs waveform shaping of an output of the power amplifier;

an analogue to digital converting section that obtains output power data for each mode by sampling a filtered signal in compressed mode and sampling a filtered signal in uncompressed mode at a same phase as the filtered signal in compressed mode; and
a transmission power controlling section that controls output power of the power amplifier upon a mode change, based on the output power data for each mode obtained in the analogue to digital converting section, wherein the analogue to digital converting section performs sampling at a sampling frequency of 960 kHz.

7. A transmission apparatus with a mode of operating a power amplifier in a compressed mode and a mode of operating the power amplifier in an uncompressed mode, the apparatus comprising:
 a filter that performs waveform shaping of an output of the power amplifier;
 an analogue to digital converting section that obtains output power data for each mode by sampling a filtered signal in compressed mode and sampling a filtered signal in uncompressed mode at a same phase as the filtered signal in compressed mode; and
 a transmission power controlling section that controls output power of the power amplifier upon a mode change, based on the output power data for each mode obtained in the analogue to digital converting section, wherein:
 the transmission apparatus transmits a spread modulated signal spread by a spreading code; and
 modes at the analogue to digital converting section provide between first sampling timings of modes an interval of integral multiples of a fundamental period of the spread modulated signal resulting from a pattern of the spreading code.

8. A transmission apparatus with a mode of operating a power amplifier in a compressed mode and a mode of operating the power amplifier in an uncompressed mode, the apparatus comprising:
 a filter that performs waveform shaping of an output of the power amplifier;
 an analogue to digital converting section that obtains output power data for each mode by sampling a filtered signal in compressed mode and sampling a filtered signal in uncompressed mode at a same phase as the filtered signal in compressed mode; and
 a transmission power controlling section that controls output power of the power amplifier upon a mode change, based on the output power data for each mode obtained in the analogue to digital converting section, wherein:
 the transmission apparatus transmits a spread modulated signal spread by a spreading code; and
 the analogue to digital converting section performs sampling at a timing avoiding candidate timings where peaks appear in a period of integral multiples of a fundamental period of the spread modulated signal resulting from a pattern of the spreading code.

9. A transmission power controlling method performed by a transmission apparatus with a mode of operating a power amplifier in a compressed mode and a mode of operating the power amplifier in an uncompressed mode, the method comprising:
 a filtering step of performing waveform shaping of an output of the power amplifier;
 a first sampling step of obtaining output power data for a current mode by sampling a filtered signal in the current mode;
 a mode changing step of changing the current mode to the other mode;
 a second sampling step of obtaining output power data for the other mode by sampling a filtered signal in the other mode at a same phase as the filtered signal in the current mode; and
 a transmission power controlling step of controlling output power of the power amplifier upon a mode change, based on the output power data for the current mode and the other mode, wherein:
 the transmission apparatus transmits a spread modulated signal spread by a spreading code; and
 the sampling in the first and second sampling steps is started from the same phase at a sampling frequency equal to a fundamental frequency of the spread modulated signal resulting from a pattern of the spreading code.

10. The transmission power controlling method according to claim 9, wherein the sampling frequency in the first and the second sampling steps is 960 kHz.

11. A transmission power controlling method performed by a transmission apparatus with a mode of operating a power amplifier in a compressed mode and a mode of operating the power amplifier in an uncompressed mode, the method comprising:
 a filtering step of performing waveform shaping of an output of the power amplifier;
 a first sampling step of obtaining output power data for a current mode by sampling a filtered signal in the current mode;
 a mode changing step of changing the current mode to the other mode;
 a second sampling step of obtaining output power data for the other mode by sampling a filtered signal in the other mode at a same phase as the filtered signal in the current mode; and
 a transmission power controlling step of controlling output power of the power amplifier upon a mode change, based on the output power data for the current mode and the other mode, wherein:
 the transmission apparatus transmits a spread modulated signal spread by a spreading code; and
 the sampling in the first and second sampling steps is started from the same phase at a sampling frequency of integral multiples of a fundamental frequency of the spread modulated signal resulting from a pattern of the spreading code.

12. A transmission power controlling method performed by a transmission apparatus with a mode of operating a power amplifier in a compressed mode and a mode of operating the power amplifier in an uncompressed mode, the method comprising:
 a filtering step of performing waveform shaping of an output of the power amplifier;
 a first sampling step of obtaining output power data for a current mode by sampling a filtered signal in the current mode;
 a mode changing step of changing the current mode to the other mode;
 a second sampling step of obtaining output power data for the other mode by sampling a filtered signal in the other mode at a same phase as the filtered signal in the current mode; and
 a transmission power controlling step of controlling output power of the power amplifier upon a mode change, based on the output power data for the current mode and the other mode, wherein the sampling frequency in the first and second sampling steps is 960 kHz.

13. A transmission power controlling method performed by a transmission apparatus with a mode of operating a power amplifier in a compressed mode and a mode of operating the power amplifier in an uncompressed mode, the method comprising:

a filtering step of performing waveform shaping of an output of the power amplifier;

a first sampling step of obtaining output power data for a current mode by sampling a filtered signal in the current mode;

a mode changing step of changing the current mode to the other mode;

a second sampling step of obtaining output power data for the other mode by sampling a filtered signal in the other mode at a same phase as the filtered signal in the current mode; and a transmission power controlling step of controlling output power of the power amplifier upon a mode change, based on the output power data for the current mode and the other mode, wherein an interval of integral multiples of a fundamental period of a spread modulated signal resulting from a pattern of a spreading code is provided between first sampling timings of the first and second sampling steps.

14. A transmission power controlling method performed by a transmission apparatus with a mode of operating a power amplifier in a compressed mode and a mode of operating the power amplifier in an uncompressed mode, the method comprising:

a filtering step of performing waveform shaping of an output of the power amplifier;

a first sampling step of obtaining output power data for a current mode by sampling a filtered signal in the current mode;

a mode changing step of changing the current mode to the other mode;

a second sampling step of obtaining output power data for the other mode by sampling a filtered signal in the other mode at a same phase as the filtered signal in the current mode; and a transmission power controlling step of controlling output power of the power amplifier upon a mode change, based on the output power data for the current mode and the other mode, wherein:

the transmission apparatus transmits a spread modulated signal spread by a spreading code; and the sampling in the first and second sampling steps is performed avoiding candidate timings where peaks appear in a period of integral multiples of a fundamental period of the spread modulated signal resulting from a pattern of the spreading code.

* * * * *